US011835338B2

(12) United States Patent
Soejima

(10) Patent No.: US 11,835,338 B2
(45) Date of Patent: Dec. 5, 2023

(54) SENSOR ELEMENT, ANGULAR VELOCITY SENSOR, AND MULTI-AXIS ANGULAR VELOCITY SENSOR

(71) Applicant: KYOCERA Corporation, Kyoto (JP)

(72) Inventor: Munetaka Soejima, Soraku-gun (JP)

(73) Assignee: Kyocera Corporation, Kyoto (JP)

( * ) Notice: Subject to any disclaimer, the term of this patent is extended or adjusted under 35 U.S.C. 154(b) by 1173 days.

(21) Appl. No.: 16/479,442

(22) PCT Filed: Jan. 22, 2018

(86) PCT No.: PCT/JP2018/001724
§ 371 (c)(1),
(2) Date: Jul. 19, 2019

(87) PCT Pub. No.: WO2018/139396
PCT Pub. Date: Aug. 2, 2018

(65) Prior Publication Data
US 2019/0376789 A1 Dec. 12, 2019

(30) Foreign Application Priority Data
Jan. 24, 2017 (JP) .................................. 2017-009946

(51) Int. Cl.
*G01C 19/5621* (2012.01)
*G01C 19/5656* (2012.01)
(Continued)

(52) U.S. Cl.
CPC ........ *G01C 19/5621* (2013.01); *B81B 3/0018* (2013.01); *H10N 30/03* (2023.02); *H10N 30/302* (2023.02); *B81B 2201/02* (2013.01)

(58) Field of Classification Search
CPC ............ G01C 19/5607; G01C 19/5621; G01C 19/5656
See application file for complete search history.

(56) References Cited

U.S. PATENT DOCUMENTS 6,018,212 A * 1/2000 Kikuchi ............. G01C 19/5607
310/366
2005/0011267 A1 1/2005 Kikuchi

FOREIGN PATENT DOCUMENTS

EP 0915322 A2 * 5/1999
FR 2969278 A1 * 6/2012 ........... B81B 3/0018
(Continued)

*Primary Examiner* — Jill E Culler
*Assistant Examiner* — Ruben C Parco, Jr.
(74) *Attorney, Agent, or Firm* — Volpe Koenig

(57) ABSTRACT

A sensor element includes a piezoelectric body, a plurality of excitation electrodes, and a plurality of detecting electrodes. The piezoelectric body includes a frame and a driving arm and detecting arm which extend from the frame within a predetermined plane parallel to an xy plane in an orthogonal coordinate system xyz. The excitation electrodes are located on the driving arm. The detecting electrodes are located on the detecting arm enabling detection of a signal generated by bending deformation of the detecting arm in a z-axis direction. The detecting arm includes first and second arms. The first arm extends from the frame in the predetermined plane. The second arm extends from a front end side of the first arm toward a frame side within the predetermined plane. An end part of the second arm on the frame side is formed as a free end.

11 Claims, 13 Drawing Sheets

(51) Int. Cl.
   *B81B 3/00*          (2006.01)
   *H10N 30/03*         (2023.01)
   *H10N 30/30*         (2023.01)

(56) References Cited

FOREIGN PATENT DOCUMENTS

JP    2005-037235 A        2/2005
JP     2015099130 A   *   5/2015

* cited by examiner

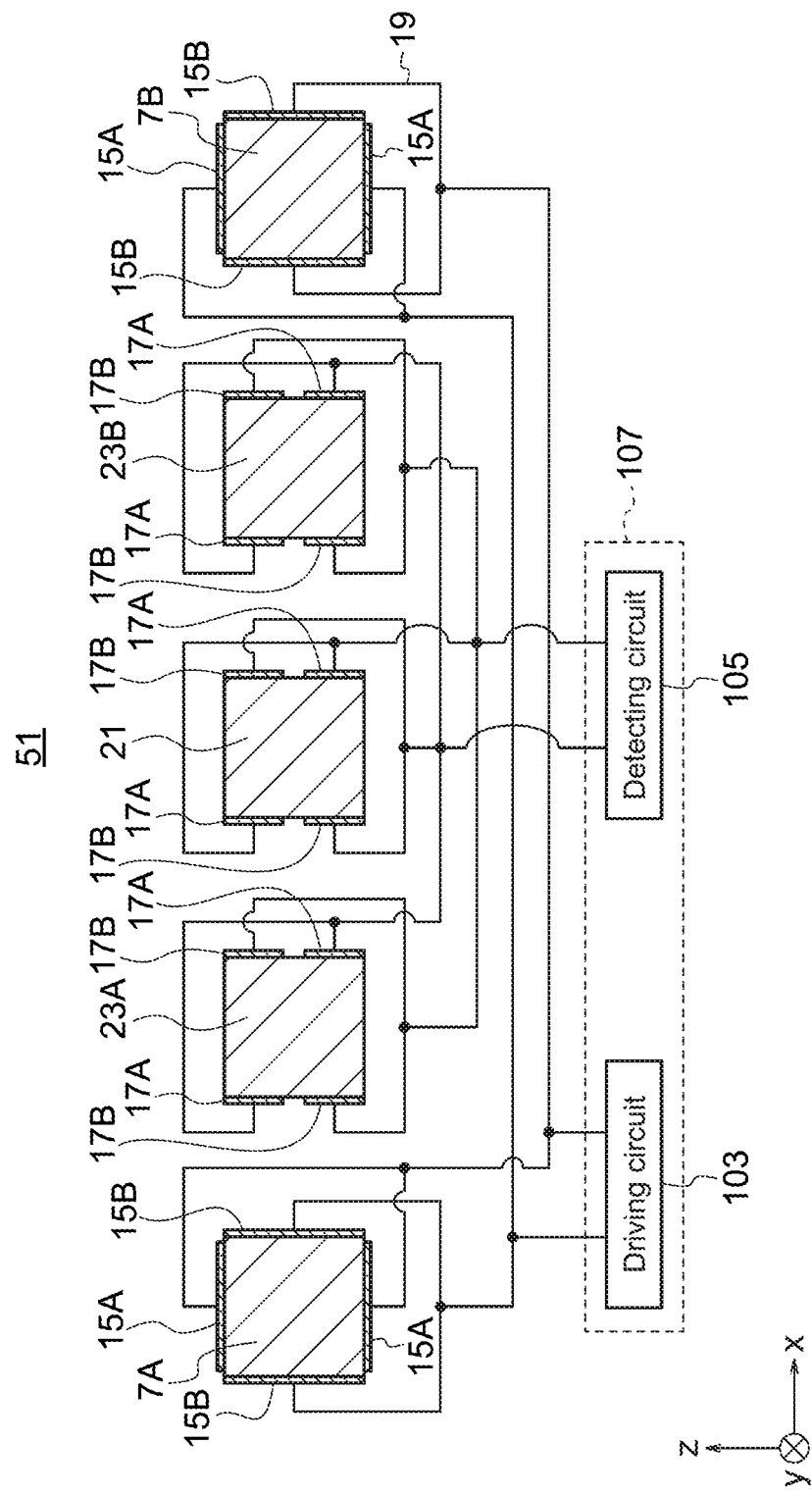

FIG. 10A
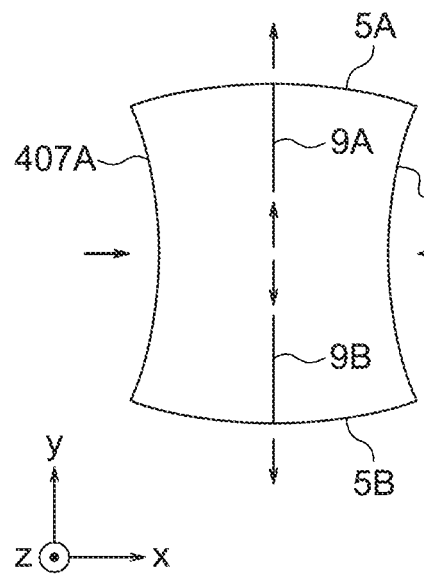
FIG. 10B
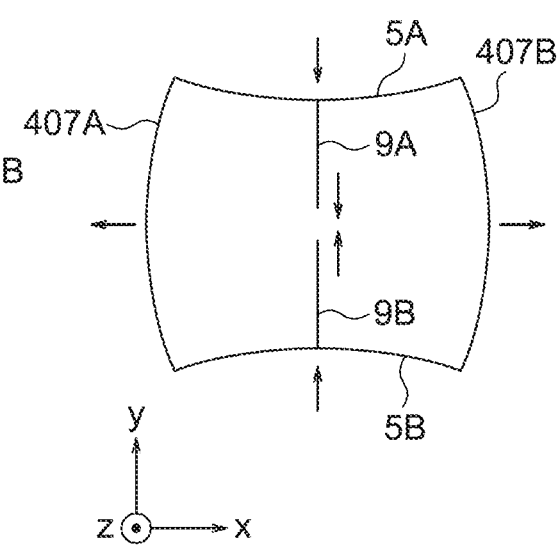
FIG. 10C
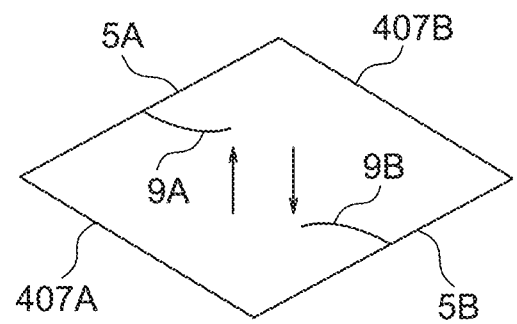
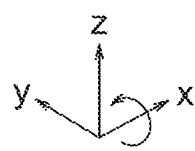
FIG. 10D
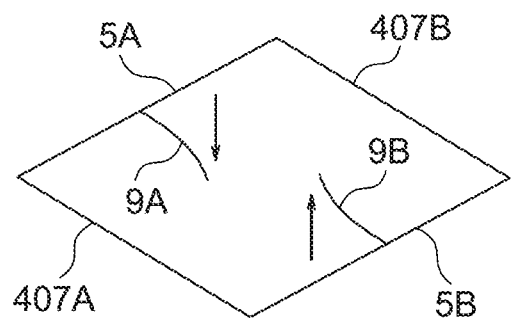
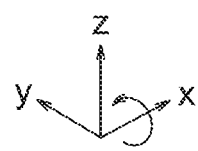

SENSOR ELEMENT, ANGULAR VELOCITY SENSOR, AND MULTI-AXIS ANGULAR VELOCITY SENSOR

TECHNICAL FIELD

The present disclosure relates to a sensor element, an angular velocity sensor including the sensor element, and a multi-axis angular velocity sensor including the angular velocity sensor.

BACKGROUND ART

Known in the art (for example Patent Literature 1) is a so-called piezoelectric vibration type angular velocity sensor. In this sensor, an AC voltage is supplied to a piezoelectric body to excite the piezoelectric body. When this excited piezoelectric body is rotated, a Coriolis force having a magnitude in accordance with the rotation speed (angular velocity) is generated in a direction perpendicular to the direction of excitation. The piezoelectric body vibrates by this Coriolis force. Further, by detecting an electrical signal generated in accordance with the deformation of the piezoelectric body caused by this Coriolis force, the angular velocity of the piezoelectric body can be detected.

CITATION LIST

Patent Literature

Patent Literature 1: Japanese Patent Publication No. 2005-037235

SUMMARY OF INVENTION

A sensor element according to one aspect of the present disclosure includes a piezoelectric body, a plurality of excitation electrodes, and a plurality of detecting electrodes. The piezoelectric body includes abase part and a driving arm and detecting arm which extend from the base part within a predetermined plane parallel to an xy plane in an orthogonal coordinate system xyz. The plurality of excitation electrodes are located on the driving arm. The plurality of detecting electrodes are located on the detecting arm in an arrangement enabling detection of a signal generated by bending deformation of the detecting arm in a z-axis direction. The detecting arm includes a first arm and second arm. The first arm extends from the base part in the predetermined plane. The second arm is connected to a front end side portion of the first arm and extend from a front end side of the first arm toward a base part side within the predetermined plane. An end part of the second arm on the base part side is formed as a free end.

An angular velocity sensor according to one aspect of the present disclosure includes a sensor element described above, a driving circuit supplying voltages to the plurality of excitation electrodes, and a detecting circuit detecting the signals from the plurality of detecting electrodes.

A multi-axis angular velocity sensor according to one aspect of the present disclosure includes an x-axis sensor detecting an angular velocity around an x-axis in an orthogonal coordinate system xyz, a y-axis sensor detecting an angular velocity around a y-axis, and a z-axis sensor detecting an angular velocity around a z-axis. The x-axis sensor is the angular velocity sensor described above. The driving arm, the first arm, and the second arm extend in the y-axis direction. The driving circuit supplies voltages to the plurality of excitation electrodes so that the driving arm vibrates in the x-axis direction. The y-axis sensor includes a piezoelectric body, a y-axis driving circuit, and a y-axis detecting circuit. The piezoelectric body in the y-axis sensor includes a y-axis driving arm and y-axis detecting arm which extend in the y-axis direction. The y-axis driving circuit supplies voltages to the y-axis driving arm so that the y-axis driving arm vibrates in the x-axis direction. The y-axis detecting circuit detects signals generated by bending deformation of the y-axis detecting arm in the z-axis direction. The z-axis sensor includes a piezoelectric body, a z-axis driving circuit, and a z-axis detecting circuit. The piezoelectric body in the z-axis sensor includes a z-axis driving arm and z-axis detecting arm which extend in the y-axis direction. The z-axis driving circuit supplies voltages to the z-axis driving arm so that the z-axis driving arm vibrates in the x-axis direction. The z-axis detecting circuit detects signals generated by bending deformation of the z-axis detecting arm in the x-axis direction.

BRIEF DESCRIPTION OF DRAWINGS

FIG. 3 is a cross-sectional view taken along the line in FIG. 2.

FIG. 10A, FIG. 10B, FIG. 10C, and FIG. 10D are schematic views for explaining the mode of operation of the sensor element in FIG. 9.

DESCRIPTION OF EMBODIMENTS

Below, embodiments according to the present disclosure will be explained with reference to the drawings. Note that, the following drawings are schematic ones. Therefore, details will be sometimes omitted. Further, size ratios etc. do not always coincide with the actual ones. Further, size ratios in the plurality of drawings do not always coincide with each other.

Further, to each of the drawings, for convenience of explanation, an orthogonal coordinate system xyz is attached. Note that, the orthogonal coordinate system xyz is defined based on the shape of the sensor element (piezoelectric body). That is, the x-axis, y-axis, and z-axis do not always indicate an electrical axis, mechanical axis, and optical axis of a crystal. In the sensor element, any direction may be defined as "above" or "below". In the following explanation, however, for convenience, sometimes the "upper surface" or "lower surface" and other terms will be used where the positive side in the z-axis direction is the upper part. Further, when simply referred to as "viewed on a plane", it means "viewed in the z-axis direction" unless particularly explained otherwise.

For the same or similar configurations, sometimes additional notations of alphabetic letters which are different from each other will be attached such as with the "driving arm 7A" and "driving arm 7B". Further, in this case, sometimes the configurations will be simply referred to as the "driving arms 7" and will not be differentiated.

In the second and following embodiments, for the configurations which are common or similar to the configurations in the already explained embodiments, the notations which were attached to the configurations in the already explained embodiments will be used. Further, sometimes illustration and explanations will be omitted. Note that, for configurations corresponding (similar) to the configurations in the already explained embodiments, even in a case where notations which are different from those for the configurations in the already explained embodiments are attached, the matters not particularly described are the same as those of the configurations in the already explained embodiments.

First Embodiment

Figure 1:
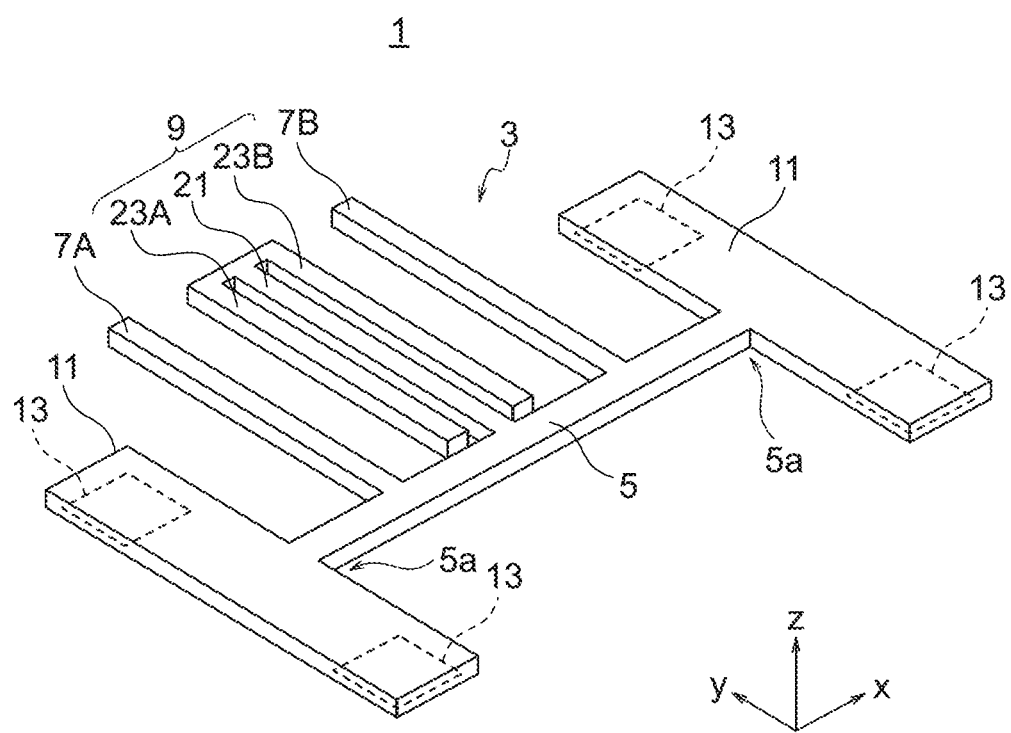
FIG. 1 is a perspective view showing a piezoelectric body in a sensor element according to a first embodiment.

FIG. 1 is a perspective view showing the configuration of a sensor element 1 according to a first embodiment. However, in this view, basically illustration of a conductive layer which is provided on the surface of the sensor element 1 is omitted.

The sensor element 1 for example configures a piezoelectric vibration type angular velocity sensor 51 (notation is shown in FIG. 3) which detects the angular velocity around the x-axis. The sensor element 1 has a piezoelectric body 3. When the piezoelectric body 3 is rotated in a state where voltage is supplied to the piezoelectric body 3 and the piezoelectric body 3 is vibrating, vibration is generated by a Coriolis force in the piezoelectric body 3. By detecting the voltage generated due to the vibration by this Coriolis force, the angular velocity is detected. Specifically, this is as follows.

(Shape of Piezoelectric Body)

The piezoelectric body 3 is for example formed integrally as a whole. The piezoelectric body 3 may be a single crystal or polycrystal. Further, the material for the piezoelectric body 3 may be suitably selected. For example, it is a quartz crystal ($SiO_2$), $LiTaO_3$, $LiNbO_3$, PZT, or silicon.

In the piezoelectric body 3, the electrical axis or polarization axis (below, sometimes only the polarization axis will be referred to as representative of the two) are set so as to coincide with the x-axis. Note that, the polarization axis may be inclined relative to the x-axis within a predetermined range (for example 15° or less) as well. Further, in a case where the piezoelectric body 3 is a single crystal, the mechanical axis and optical axis may be made suitable directions. For example, the mechanical axis is made the y-axis direction and the optical axis is made the z-axis direction.

The piezoelectric body 3 is for example made constant in thickness (z-axis direction) as a whole. Further, the piezoelectric body 3 is formed in a line symmetrical shape relative to a not shown symmetrical axis parallel to the y-axis.

The piezoelectric body 3 for example has a frame 5, a pair of driving arms 7A and 7B and a detecting arm 9 which extend from the frame 5, and a pair of mounting parts 11 supporting the frame 5. The frame 5, pair of driving arms 7, detecting arm 9, and pair of mounting parts 11 for example extend within the same plane parallel to the xy plane.

The pair of driving arms 7 are portions which are excited by supply of voltage (electric field). The detecting arm 9 is a portion which vibrates due to the Coriolis force and generates an electrical signal (for example voltage) in accordance with the angular velocity. The frame 5 is a portion which contributes to support of the driving arms 7 and detecting arm 9 and transfer of vibration from the driving arms 7 to the detecting arm 9. The mounting parts 11 are portions contributing to mounting of the sensor element 1 on a not shown mounting body (for example a portion of a package or a circuit board).

The frame 5 for example has a long shape having two ends separated from each other in the x-axis direction. Specifically, for example, the frame 5 linearly extends in the x-axis direction. The two ends of the frame 5 become supported parts 5a which are supported by the pair of mounting parts 11. Accordingly, the frame 5 becomes able to flexurally deform like a beam supported at its two ends.

The cross-sectional shape of the frame 5 is for example schematically rectangular. Either of the width (y-axis direction) or thickness (z-axis direction) of the frame 5 may be larger than the other. However, the frame 5, as will be explained later, is designed to flexurally deform when viewed on a plane. Accordingly, the width of the frame 5 may be made relatively small. For example, the width of the frame 5 may be made 2 times or less or made 1 time or less of the thickness of the frame 5. Further, for example, the length and width of the frame 5 may be adjusted so that the natural frequency of the flexural deformation becomes closer to the natural frequency of the driving arms 7 in a direction in which they are excited by application of voltage and/or the natural frequency of the detecting arm 9 in a direction in which it vibrates due to the Coriolis force.

The driving arms 7 extend from the frame 5 in the y-axis direction. Their front ends are formed as free ends. Accordingly, the driving arms 7 become able to flexurally deform like a cantilever. The pair of driving arms 7 extend alongside each other (for example in parallel) at positions separated from each other in the x-axis direction. The pair of driving arms 7 are for example provided line symmetrical relative to a not shown symmetrical axis which passes through the center between the pair of supported parts 5a and is parallel to the y-axis.

The specific shapes etc. of the driving arms 7 may be suitably set. For example, the driving arms 7 are long rectangular cuboid shaped. That is, the cross-sectional shape (xz plane) is rectangular. Although not particularly shown, the driving arm 7 may be hammer shaped with the width (x-axis direction) becoming broader at the front end side portion as well. The pair of driving arms 7 are for example substantially mutually symmetrically shaped and sized. Accordingly, the vibration characteristics of the two are equal to each other.

The driving arms 7 are excited in the x-axis direction as will be explained later. Accordingly, in the driving arms 7, the larger the width (x-axis direction), the higher the natural frequency in the excitation direction (x-axis direction). Further, the larger the length (mass from another viewpoint), the lower the natural frequency in the excitation direction. The various dimensions of the driving arms 7 are for example set so that the natural frequency in the excitation direction of the driving arms 7 becomes close to the frequency at which excitation is desired be caused.

The detecting arm 9 has a first arm 21 extending from the frame 5 and has second arms 23A and 23B extending from the front end side and lateral sides of the first arm 21 toward the frame 5 side. The front ends of the second arms 23 are not connected to the frame 5, but become free ends. Accordingly, in the detecting arm 9, the first arm 21 can flexurally deform with the frame 5 as the fixed end side and with its front end side as the free end side. Further, the second arms 23 can flexurally deform with respect to the first arm 21 as the standard by making the sides of connection with the first arm 21 the fixed end sides and make the frame 5 sides the free end sides. Note that, the "front end side of the first arm 21" for example designates a further front end side from the center in the long direction of the first arm 21. The first arm 21 and pair of second arms 23 for example extend within the same plane parallel to the xy plane.

The first arm 21 for example extends from the frame 5 in the y-axis direction at a position between the pair of driving arms 7 in the x-axis direction. Further, the first arm 21 for example extends toward the same side (positive side in the y-axis direction) as the side of extension of the pair of driving arms 7. From another viewpoint, the first arm 21 extends alongside (for example in parallel to) the pair of driving arms 7. The first arm 21 is for example positioned at the center between the pair of supported parts 5a and/or positioned at the center between the pair of driving arms 7. The length of the first arm 21 is for example about the same as the lengths of the driving arms 7.

The pair of second arms 23 are for example made line symmetrical positions and shapes relative to the first arm 21. The second arms 23 for example extend in the y-axis direction and in turn extend alongside (for example in parallel to) the first arm 21. The second arms 23 are for example connected at their end parts to the front end part of the first arm 21. Specifically, between the side surfaces of the first arm 21 and the side surfaces of the second arms 23 which face them, connection parts (notation is omitted) having the same thicknesses (z-axis direction) as those of these arms are interposed. The lengths of the second arms 23 are for example lengths which are obtained by subtracting gaps between the second arms 23 and the frame 5 from the lengths of the driving arms 7 and first arm 21. The gaps are for example made relatively small.

The specific shapes etc. of the first arm 21 and second arms 23 may be suitably set. For example, each of the first arm 21 and second arms 23 is made long rectangular cuboid shaped. That is, the cross-sectional shape (xz plane) is rectangular. Although not particularly shown, the second arms 23 may be hammer shaped with widths (x-axis direction) becoming broader at the end parts on the frame 5 side as well. Further, the second arms 23 may be hammer shaped so that the widths becomes broader toward the sides opposite to the first arm 21 in the end parts on the sides where they are connected to the first arm 21.

The detecting arm 9 (first arm 21 and second arms 23), as will be explained later, vibrates in the z-axis direction due to the Coriolis force in the present embodiment. Accordingly, in the detecting arm 9, the larger the thickness (z-axis direction), the higher the natural frequency in the vibration direction (z-axis direction). Further, the larger the length (from another viewpoint, mass), the lower the natural frequency in the vibration direction. The various dimensions of the detecting arm 9 for example may be set so that the natural frequency in the vibration direction of the detecting arm 9 becomes closer to the natural frequency in the excitation direction of the driving arms 7.

Further, the intervals between the first arm 21 and the second arms 23, the intervals between the second arms 23 and the frame 5, and the dimensions of the connection portions of the first arm 21 and the second arms 23 may also be suitably set. For example, the above intervals are set so that the portions seldom abut against each other. Further, for example, the areas of the yz cross-sections of the connection portions of the first arm 21 and the second arms 23 may be smaller than, equal to, or larger than the area of the xz cross-sections of the first arm 21 or second arms 23. Note that, when the areas of the yz cross-sections of the connection portions are made larger, for example, it becomes easier to transfer a moment about the x-axis from the second arms 23 to the first arm 21.

The pair of mounting parts 11 are for example formed in shapes having the y-axis direction as the long directions. More specifically, for example, the mounting parts 11 are plate shaped having rectangular planar shapes so that the z-axis direction becomes the thickness direction. The widths (x-axis direction) of the mounting parts 11 are for example broader than the width (y-axis direction) of the frame 5, widths (x-axis direction) of the driving arms 7, and the width (x-axis direction) of the detecting arm 9 (first arm 21 or second arms 23 in that). Accordingly, the mounting parts 11 become harder to flexurally deform (vibration) when viewed on a plane compared with the other portions (5, 7, 21, and 23). However, the mounting parts 11, in part or whole, may be made narrower in width compared with the other portions (5, 7, 21, or 23) as well. The lengths of the mounting parts 11 may be suitably set. For example, the length from the frame 5 up to single ends of the mounting parts 11 may be shorter than (example shown), equal to, or longer than the lengths of the driving arms 7 or detecting arm 9.

The frame 5, as already explained, is fixed at its two ends (supported portions 5a) to the pair of mounting parts 11. The positions of the supported portions 5a in the y-axis direction relative to the mounting parts 11 may be suitable ones. In the example shown, the supported portions 5a are positioned at the center in the y-axis direction of the mounting parts 11.

The lower surfaces of the pair of mounting parts 11 are provided with at least four pads 13. The pads 13 face pads provided on a not shown mounting body and are bonded with the pads on the mounting body by bumps made of solder or conductive adhesive. Due to this, electrical connection of the sensor element 1 and the mounting body is achieved. Further, the frame 5, driving arms 7, and detecting arm 9 are supported in a state where they float above the mounting body and become able to vibrate. Note that, the frame 5 ends up being supported upon the pads 13 through the mounting parts 11 in the portions closer to the two sides of the x-axis direction (supported portions 5a) than the pair of driving arms 7. The four pads 13 are for example provided on the two ends in the pair of mounting parts 11.

(Conductors of Sensor Element)

Figure 2:
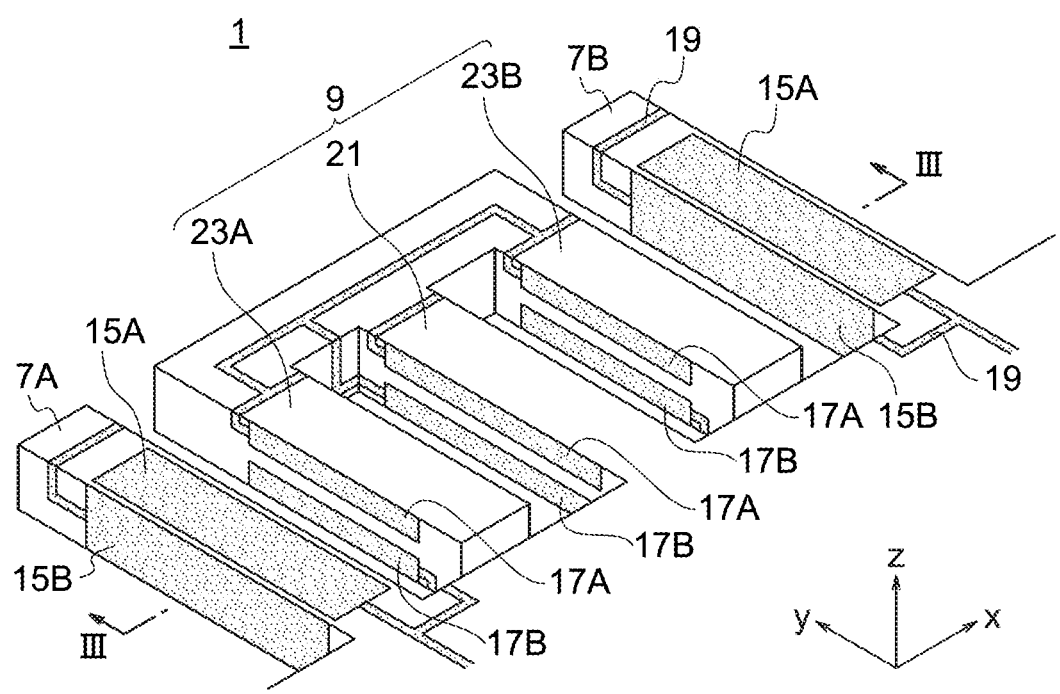
FIG. 2 is a perspective view showing a portion of the sensor element in FIG. 1 in an enlarged manner.

FIG. 2 is a perspective view showing a portion of the sensor element 1 in an enlarged manner. Further, FIG. 3 is a cross-sectional view taken along the III-III line in FIG. 2.

The sensor element 1 has, as conductors which are provided on the surface etc. of the piezoelectric body 3 other than the pads 13 described above, excitation electrodes 15A and 15B for supplying voltages to the driving arms 7, detecting electrodes 17A and 17B for extracting signals generated in the detecting arm 9, and a plurality of wirings 19 connecting these electrodes. These conductors are configured by conductor layers formed on the surface of the piezoelectric body 3. The materials for the conductor layers are for example Cu, Al, or another metal.

Note that, the additional notations A and B of the excitation electrodes 15 and detecting electrodes 17 are attached based on the orthogonal coordinate system xyz. Accordingly, as will be explained later, the excitation electrode 15A on one driving arm 7 and the excitation electrode 15A on the other driving arm 7 do not always have the same potential. The same is true for the excitation electrodes 15B and detecting electrodes 17A and 17B.

(Excitation Electrodes)

At each of the driving arms 7, the excitation electrode 15A is provided at each of the upper surface and lower surface (a pair of surfaces facing the two sides in the z-axis direction). Further, at each of the driving arms 7, the excitation electrode 15B is provided at each of the pair of side surfaces (a pair of surfaces facing the two sides in the x-axis direction).

Note that, in the embodiments which will be explained later, sometimes provision is made of driving arms 7 which extend from the frame 5 toward the negative side in the y-axis direction. In such driving arms 7 as well, the additional notations "A" of the excitation electrodes 15 correspond to the upper surfaces and lower surfaces, and the additional notations "B" of the excitation electrodes 15 correspond to the side surfaces.

On each of the upper, lower, left, and right surfaces of each of the driving arms 7, the excitation electrode 15 is for example formed so as to cover most of the surface. However, at least one of each two excitation electrodes 15A and 15B (excitation electrodes 15A in the present embodiment) is formed smaller in the width direction than the surface so that the electrodes are not short-circuited with each other. Further, parts of the root sides and front end sides of the driving arms 7 may be made positions where no excitation electrodes 15 are arranged.

At each of the driving arms 7, the two excitation electrodes 15A are for example given the same potential as each other. For example, the two excitation electrodes 15A are connected to each other by the wiring 19. Further, at each of the driving arms 7, the two excitation electrodes 15B are for example given the same potential as each other. For example, the two excitation electrodes 15B are connected to each other by the wiring 19.

In such arrangement and connection relationships of the excitation electrodes 15, if voltage is supplied between the excitation electrodes 15A and the excitation electrodes 15B, for example, in the driving arms 7, an electric field going from the upper surface toward the pair of side surfaces (two sides in the x-axis direction) and an electric field going from the lower surface toward the pair of side surfaces are generated. On the other hand, the polarization axis matches with the x-axis direction. Accordingly, when focusing on the components in the x-axis direction of the electric fields, in the driving arm 7, the orientation of the electric field and the orientation of the polarization axis match in one side portion of the x-axis direction, while the orientation of the electric field and the orientation of the polarization axis become inverse to each other in the other side portion.

As a result, single side portions of the driving arms 7 in the x-axis direction contract in the y-axis direction, and the other side portions extend in the y-axis direction. Further, the driving arms 7 flex to one side in the x-axis direction like a bimetal. If the voltages supplied to the excitation electrodes 15A and 15B are inverted, the driving arms 7 flex to an inverse direction. According to such a principle, if an AC voltage is supplied to the excitation electrodes 15A and 15B, the driving arms 7 vibrate in the x-axis direction.

Note that, although particularly not shown, one or more recessed grooves extending along the long directions of the driving arms 7 (a recessed groove may be configured by a plurality of recessed parts arranged in the long direction of the driving arm 7 as well) may be provided in the upper surfaces and/or lower surfaces of the driving arms 7, and the excitation electrodes 15A may be provided over the interiors of the recessed grooves. In this case, the excitation electrodes 15A and the excitation electrodes 15B face each other in the x-axis direction while sandwiching the wall portions of the recessed grooves therebetween, therefore the efficiency of excitation is improved.

Between the pair of driving arms 7, the excitation electrodes 15A on the driving arm 7A and the excitation electrodes 15B on the driving arm 7B are given the same potential, while the excitation electrodes 15B on the driving arm 7A and the excitation electrodes 15A on the driving arm 7B are given the same potential. The excitation electrodes 15 which must be given the same potential are for example connected to each other by the wiring 19.

Accordingly, if applying AC voltage between the excitation electrodes 15A and the excitation electrodes 15B, voltages having inverse phases from each other are supplied to the pair of driving arms 7, therefore the arms vibrate so as to flexurally deform in reverse orientations to each other in the x-axis direction.

(Detecting Electrodes)

In each of the first arm 21 and second arms 23, the detecting electrodes 17A are provided in the region on the positive side in the z-axis direction (for example, the side more positive than the center of the surface) in the surface facing the negative side in the x-axis direction and in the region on the negative side in the z-axis direction (for example, the side more negative than the center of the surface) in the surface facing the positive side in the x-axis direction. In each of the detecting arm 9, the detecting electrodes 17B are provided in the region on the negative side in the z-axis direction (for example, the side more negative than the center of the surface) in the surface facing the negative side in the x-axis direction and in the region on the positive side in the z-axis direction (for example, the side more positive than the center of the surface) in the surface facing the positive side in the x-axis direction.

Note that, in the embodiments which will be explained later, sometimes provision is made of a detecting arm 9 which is positioned on the negative side in the y-axis direction relative to the frame 5. In such a detecting arm 9 as well, the additional notations "A" of the detecting electrodes 17 show the regions of +z in the side surfaces of −x and the regions of −z in the side surfaces of +x, while the additional notations "B" of the detecting electrodes 17 show the regions of −z in the side surfaces of −x and the regions of +z in the side surfaces of +x.

At each of the side surfaces of the first arm 21 and second arms 23, the detecting electrode 17A and the detecting electrode 17B extend along the arm so that they are separated by a suitable interval so as not to short-circuit with each other. In each of arms, two detecting electrodes 17A are for example connected with each other by the wiring 19. Further, in each of arms, two detecting electrodes 17B are connected with each other by for example the wiring 19.

In such an arrangement and connection relationships of the detecting electrodes 17, if the first arm 21 or second arms 23 flexurally deform in the z-axis direction, for example, an electric field parallel to the z-axis direction is generated. That is, on each of the side surfaces of the arms, voltage is generated between the detecting electrode 17A and the detecting electrode 17B. The orientations of the electric fields are determined by the orientation of the polarization axes and the orientation of the flexes (positive side or negative side in the z-axis direction). They are inverse to each other between the positive side portions and the negative side portions in the x-axis direction. These voltages (electric fields) are output to the detecting electrodes 17A and detecting electrodes 17B. When each of the arms (21 or 23) vibrates in the z-axis direction, the voltage is detected as AC voltage. Note that, among the electric fields, electric fields parallel to the z-axis direction may be dominant as described above or a ratio of the electric fields which are parallel to the x-axis direction and have inverse orientations to each other between the positive side portions and the negative side portions in the z-axis direction may be larger. In any case, voltage in accordance with the flexural deformation of each of the arms (21 or 23) in the z-axis direction is generated between the detecting electrodes 17A and the detecting electrodes 17B.

Between the pair of second arms 23, the detecting electrodes 17A are connected with each other and, further, the detecting electrodes 17B are connected with each other. In such connection relationships, if the pair of second arms 23 flexurally deform to the same sides as each other in the z-axis direction, potentials having the same polarities as each other are generated in the detecting electrodes 17 which are connected with each other. In turn, signals generated in the pair of second arms 23 are added.

Further, between the first arm 21 and the second arms 23, the detecting electrodes 17A and the detecting electrodes 17B are connected. In such connection relationships, if the first arm 21 and the second arms 23 flexurally deform to inverse sides from each other in the z-axis direction, potentials having the same polarities as each other are generated in the detecting electrodes 17 which are connected to each other. In turn, signals generated in the first arm 21 and the second arms 23 are added.

(Wirings)

The wirings 19 for example are responsible for mutual connection of the excitation electrodes 15 and mutual connection of the detecting electrodes 17 as explained above. Further, the wirings 19 connect four sets of electrodes in total and the four pads 13. The four sets of electrodes are comprised of the excitation electrodes 15 which are divided into two sets from a viewpoint of potentials and the detecting electrodes 17 divided into two sets from a viewpoint of potentials.

By suitable arrangement of the plurality of wirings 19 on the upper surfaces, lower surfaces, and/or side surfaces of various parts in the piezoelectric body 3, the connections explained above can be realized without short-circuiting with each other in a mode where the entireties thereof are provided on the surfaces of the piezoelectric body 3. However, three-dimensional wiring portions in which the wirings 19 intersect the other wirings 19 positioned on the piezoelectric body 3 above the same through insulation layers may be formed as well.

(Driving Circuit and Detecting Circuit)

As shown in FIG. 3, the angular velocity sensor 51 has a driving circuit 103 supplying voltages to the excitation electrodes 15 and a detecting circuit 105 detecting electrical signals from the detecting electrodes 17.

The driving circuit 103 is for example connected through two among the four pads 13 to the excitation electrodes 15. The driving circuit 103 is configured including for example an oscillation circuit and amplifier and supplies an AC voltage having a predetermined frequency between the excitation electrodes 15A and the excitation electrodes 15B. Note that, the frequency may be determined in advance in the angular velocity sensor 51 or may be designated from an external apparatus or the like.

The detecting circuit 105, for example, is connected through the two among the four pads 13 to the detecting electrodes 17. The detecting circuit 105, for example, is configured including an amplifier and wave detecting circuit, detects a potential difference between the detecting electrode 17A and the detecting electrode 17B, and outputs an electrical signal in accordance with the detection result to an external apparatus or the like. More specifically, for example, the potential difference described above is detected as the AC voltage, and the detecting circuit 105 outputs a signal in accordance with the amplitude of the detected AC voltage. The angular velocity is identified based on this amplitude. Further, the detecting circuit 105 outputs a signal in accordance with a phase difference between the applied voltage of the driving circuit 103 and the electrical signal which was detected. The orientation (positive/negative) of rotation is identified based on this phase difference.

Note that, the driving circuit 103 and detecting circuit 105 configure a control circuit 107 as a whole. The control circuit 107 is for example configured by a chip type IC (integrated circuit) and is mounted on a circuit board or a mounting body having a suitable shape with the sensor element 1.

(Operation of Angular Velocity Sensor)

Figure 4A:
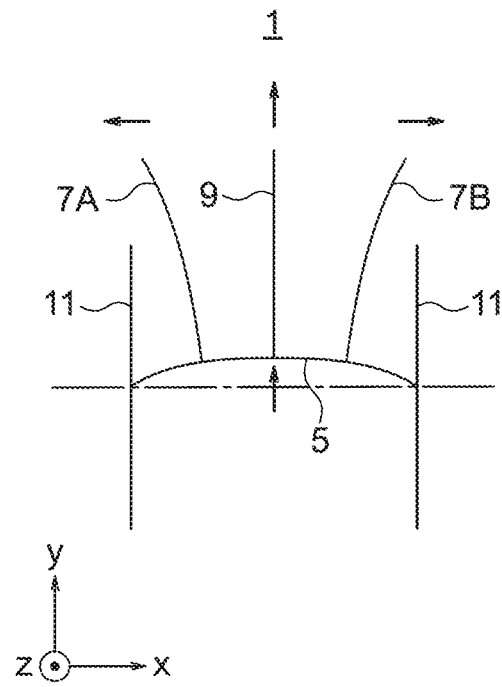
FIG. 4A, FIG. 4B, FIG. 4C, and FIG. 4D are schematic views for explaining the mode of operation of the sensor element in FIG. 1.
Figure 4B:
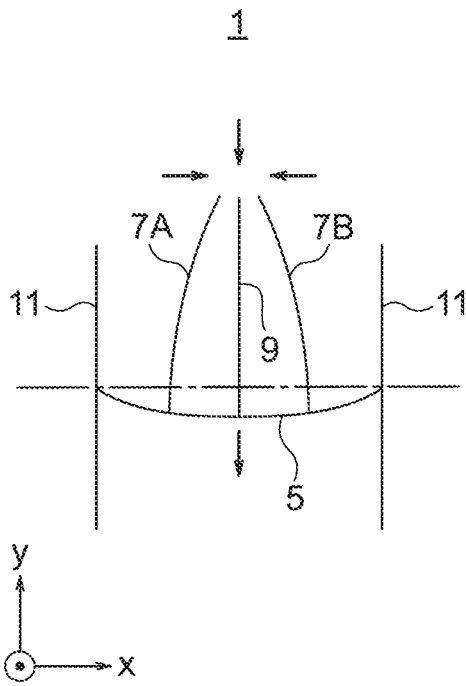

FIG. 4A and FIG. 4B are schematic plan views for explaining excitation of the piezoelectric body 3. In these views, the detecting arm 9 is schematically shown as one arm as a whole without differentiating between the first arm 21 and second arms 23.

Between FIG. 4A and FIG. 4B, phases of AC voltages supplied to the excitation electrodes 15 are offset by 180° from each other. As explained above, the driving arms 7A and 7B are excited with inverse phases from each other so as to deform in inverse orientations to each other in the x-axis direction by application of AV voltage to the excitation electrodes 15.

At this time, as shown in FIG. 4A, if the pair of driving arms 7 warp to the outer side in the x-axis direction relative to each other, the bending moments thereof are transferred to the frame 5, and the frame 5 warps to the positive side in the y-axis direction. As a result, the detecting arm 9 displaces to the positive side in the y-axis direction.

Conversely, as shown in FIG. 4B, if the pair of driving arms 7 warp to the inner sides in the x-axis direction relative to each other, bending moments thereof are transferred to the frame 5, and the frame 5 warps to the negative side in the y-axis direction. As a result, the detecting arm 9 displaces to the negative side in the y-axis direction.

Accordingly, due to excitation of the pair of driving arms 7, the detecting arm 9 vibrates (displaces) in the y-axis direction.

Figure 4C:
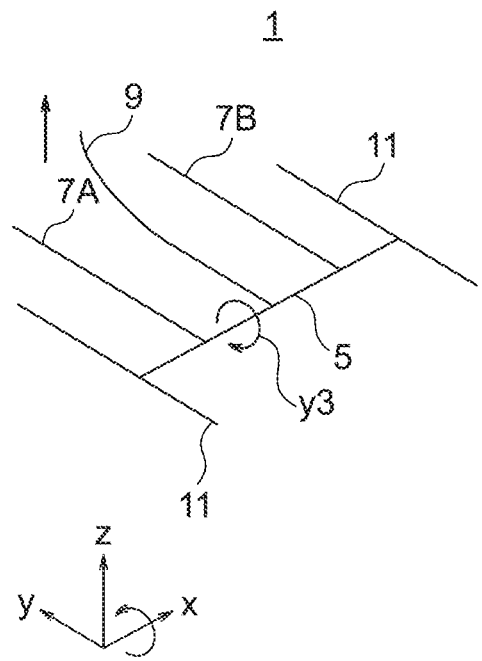
Figure 4D:
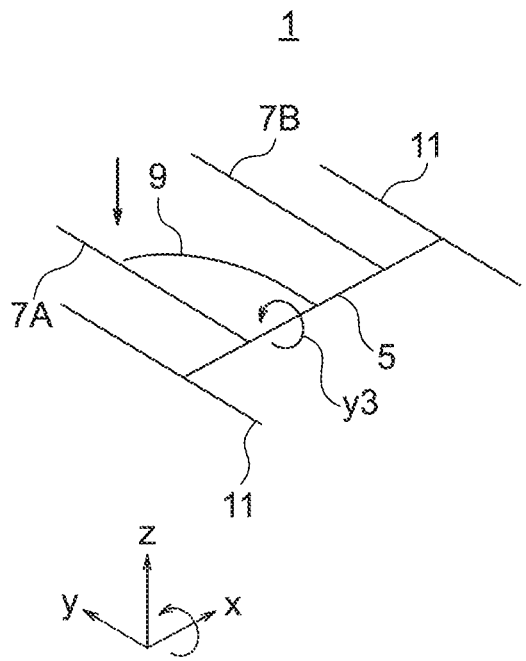

FIG. 4C and FIG. 4D are schematic perspective views for explaining the vibration of the detecting arm 9 due to the Coriolis force. In these views, however, in the same way as FIG. 4A and FIG. 4B, the first arm 21 and the second arms 23 in the detecting arm 9 are not differentiated. The entirety thereof is schematically shown as one arm. Further, in these views, illustration of deformation of the driving arms 7 and frame 5 is omitted. Parts of the other schematic views for explaining the vibration of the detecting arm are similarly omitted.

FIG. 4C and FIG. 4D correspond to the states of FIG. 4A and FIG. 4B. If the sensor element 1 is rotated around the x-axis in the state where vibration explained with reference to FIG. 4A and FIG. 4B is generated, the detecting arm 9 vibrates (is deformed) in the direction (z-axis direction) perpendicular to the rotation axis (x-axis) and to the vibration direction (y-axis direction) due to the Coriolis force since it is vibrating (displaced) in the y-axis direction.

Figure 5A:
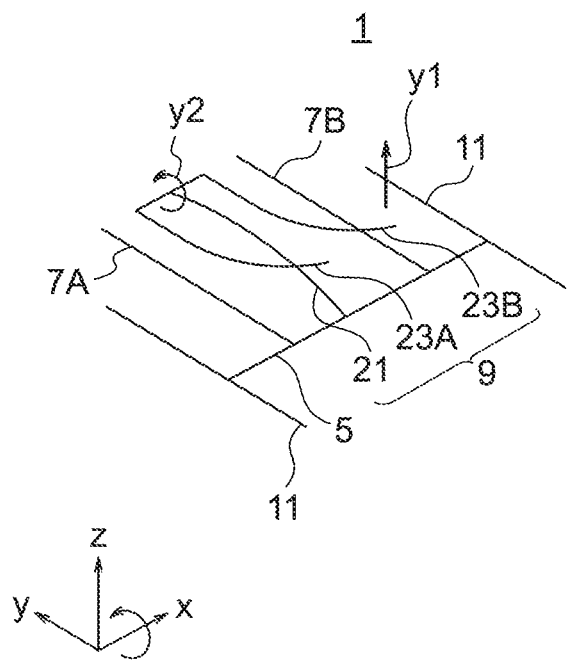
FIG. 5A and FIG. 5B are schematic views for explaining the mode of operation of the sensor element in FIG. 1.
Figure 5B:
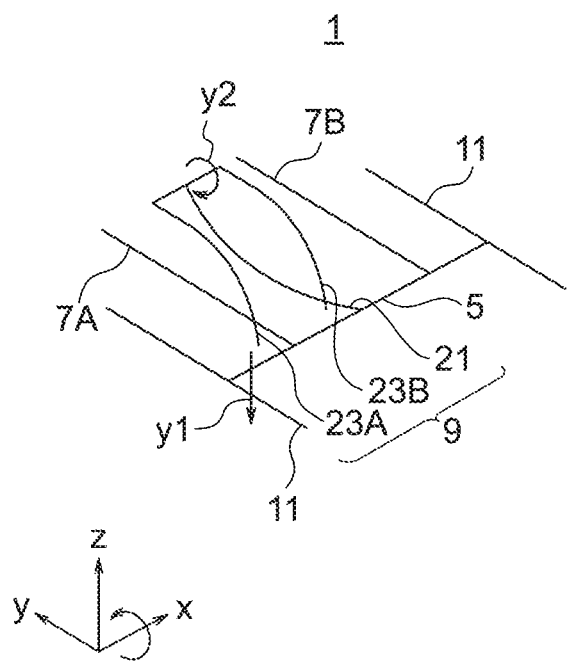

FIG. 5A and FIG. 5B are schematic perspective views for explaining the vibration of the detecting arm 9 due to the Coriolis force in more detail than FIG. 4C and FIG. 4D. In these views, the first arm 21 and second arms 23 are also schematically shown.

FIG. 5A and FIG. 5B correspond to FIG. 4C and FIG. 4D. As explained with reference to FIG. 4C and FIG. 4D, the detecting arm 9 receives the Coriolis force in the z-axis direction.

As a result, the second arms 23 flexurally deform so as to bend in the direction of the Coriolis force indicated by an arrow y1. Further, the bending moments acting to make the second arms 23 flexurally deform act upon the first arm 21 so that they are transferred through the connection portions of the second arms 23 and the first arm 21 to the first arm 21 as indicated by an arrow y2 to make the first arm 21 flexurally deform to bend to the side opposite to the direction of the Coriolis force. Accordingly, the first arm 21 and the second arms 23 end up flexurally deforming to inverse sides from each other in the z-axis direction.

The signals (voltages) generated due to the flexural deformation in the first arm 21 and second arms 23 in the z-axis direction are extracted by the detecting electrodes 17. Further, the signals generated in the first arm 21 and second arms 23 are added. The larger the angular velocity, the larger the Coriolis force (in turn the voltage of the signal detected). Due to this, the angular velocity is detected.

As described above, in the present embodiment, the sensor element 1 has a piezoelectric body 3, a plurality of excitation electrodes 15, and a plurality of detecting electrodes 17. The piezoelectric body 3 has a frame 5 (base part) and has driving arms 7 and a detecting arm 9 which extend from the frame 5 within a predetermined plane parallel to the xy plane in an orthogonal coordinate system xyz. The plurality of excitation electrodes 15 are positioned on the driving arms 7. The plurality of detecting electrodes 17 are positioned on the detecting arm 9 in an arrangement enabling detection of signals generated due to the bending deformation in the z-axis direction of the detecting arm 9. The detecting arm 9 has a first arm 21 and second arms 23. The first arm 21 extends from the frame 5 within the predetermined plane. The second arms 23 are connected to the front end side portions of the first arm 21 and extend from the front end side of the first arm 21 toward the frame 5 in the predetermined plane. The end parts of the second arms 23 on the frame 5 side are formed as free ends.

Accordingly, for example, vibration energy escaping to the frame 5 can be reduced. Specifically, this is as follows.

In FIG. 4C and FIG. 4D, the detecting arm 9 was schematically shown as if it were one arm. Here, it is assumed that the detecting arm 9 is actually configured by one arm. In this case, as indicated by an arrow y3 in FIG. 4C and FIG. 4D, the Coriolis force received by the detecting arm 9 acts as a moment acting to make the frame 5 deform (torsional deformation in the present embodiment). As a result, for example, energy making the detecting arm 9 vibrate will escape to the frame 5, so the detection sensitivity is lowered.

On the other hand, in a case where the detecting arm 9 has the first arm 21 and second arms 23, as explained with reference to FIG. 5A and FIG. 5B, moments acting to make the first arm 21 warp to the inverse direction to the direction of the Coriolis force indicated by the arrow y1 are generated. Accordingly, due to the moments in the first arm 21, the moment acting to cause deformation in the frame 5 as described above is reduced. As a result, for example, leakage of vibration energy from the detecting arm 9 to the frame 5 is reduced, so the detection sensitivity is improved.

Further, in the present embodiment, at least part of the plurality of detecting electrodes 17 are positioned on the second arms 23.

Here, when comparing the first arm 21 and the second arms 23, bending tends to become larger in the second arms 23 in which the direction of the Coriolis force and the direction of bending coincide. Accordingly, at least by providing the detecting electrodes 17 on the second arms 23, the detection sensitivity can be made higher.

Further, in the present embodiment, the plurality of detecting electrodes 17 are positioned on the first arm 21 and second arms 23. The wirings 19 connect the plurality of detecting electrodes 17 on the first arm 21 and the plurality of detecting electrodes 17 on the second arms 23 in connection relationships whereby the detecting electrodes 17 generating potentials having the same polarities as each other at the time when the first arm 21 and the second arms 23 bend to inverse sides from each other in the z-axis direction are connected to each other.

Accordingly, for example, the signals accompanying deformation of the piezoelectric body can respectively be detected in the first arm 21 and second arms 23 and these signals can be totaled up. As a result, for example, the detection sensitivity is improved compared with a mode in which the detecting electrodes 17 are provided on only either of the first arm 21 or the second arms 23 (this mode also included in the art according to the present disclosure).

Further, in the present embodiment, the detecting arm 9 has only one first arm 21 and only two second arms 23 which are positioned on the two lateral sides of the first arm 21.

Accordingly, for example, it is easy to increase the mass of the detecting arm 9 while maintaining the balance of the detecting arm 9. As a result, for example, entry of noise can be reduced. Further, for example, the two second arms 23 worth of mass is added to the front end of the single first arm 21, therefore the moment applied from the second arms 23 to the first arm 21 tends to become larger. As a result, for example, the vibration energy escaping to the frame 5 is easily reduced.

Further, in the present embodiment, the base part (frame 5) has a long shape in which the two ends are separated from each other in the x-axis direction. The piezoelectric body 3 has the pair of driving arms 7 which extend from the frame 5 alongside each other in the y-axis direction at positions where they are separated from each other in the x-axis direction. The first arm 21 extends from the frame 5 in the y-axis direction at a position between the pair of driving arms 7 in the x-axis direction. The plurality of excitation electrodes 15 are provided in an arrangement enabling supply of voltage for exciting the pair of driving arms 7 in the x-axis direction. The plurality of pads 13 are positioned in the piezoelectric body 3 so as to be able to support portions in the frame 5 (supported portions 5*a*) which are closer to the two sides in the x-axis direction than the pair of driving arms 7. The plurality of wirings 19 connect the plurality of excitation electrodes 15 in a connection relationships whereby voltages having inverse phases from each other making the pair of driving arms 7 vibrate to inverse sides from each other in the x-axis direction are supplied from the plurality of excitation electrodes 15 to the pair of driving arms 7.

Accordingly, detection by a new mode of vibration of using excitation of the pair of driving arms 7 to make the frame 5 flex (vibrate) and make the detecting arm 9 displace (vibrate) and using the Coriolis force acting upon this displacing detecting arm 9 to detect the angular velocity becomes possible.

As another mode of vibration which is different from such a mode of vibration, for example, there can be mentioned the mode of making the Coriolis force act upon the excited driving arm to cause vibration and transferring the vibration due to the Coriolis force to the detecting arm. In the new mode of vibration of the present embodiment, unlike the other modes of vibration, the Coriolis force directly acts upon the detecting arm. As a result, for example, the detection sensitivity is improved. Note that, the other modes of vibration described above may be applied to the art of the present disclosure (detecting arm having the first arm and second arm).

Further, as another mode of vibration, for example, there can be mentioned a mode in which the detecting arm is made to deform by bending (vibrate) in the same direction as the vibration direction of the driving arms (x-axis direction) and in which the Coriolis force is made to act upon this vibrating detecting arm. In the new mode of vibration of the present embodiment, the vibration direction of the detecting arm is different from that in the other mode, so it becomes possible to detect the angular velocity for the rotation axis (x-axis) for which the angular velocity could not be detected in the other mode of vibration. Note that, the other mode of vibration may also be applied to the art of the present disclosure (detecting arm having the first arm and second arm).

In the new mode of vibration in the present embodiment, the frame 5 is made relatively thin so that flexural deformation to the y-axis direction can occur. Accordingly, in the frame 5, torsional deformation is easily caused due to the Coriolis force acting upon the driving arms 7 and detecting arm 9. In the present embodiment, however, due to the mode of operation explained above resulting from the provision of the first arm 21 and second arms 23 in the detecting arm 9, this torsional deformation can be reduced. As a result, for example, the vibration energy becomes easier to seal in at the internal portion of the piezoelectric body 3, therefore the detection sensitivity can be improved.

Further, in the present embodiment, the detecting arm 9 is positioned at the center between the pair of driving arms 7.

In the new mode of vibration described above, the flexural deformation of the frame 5 tends to become larger at the center between the pair of driving arms 7. Due to the detecting arm 9 being positioned at such a position, the amplitude of the detecting arm 9 can be larger to make the detection sensitivity larger. Note that, in the art referred to as "the other mode of vibration" in which the detecting arm is made to deform by bending (vibrate) in the vibration direction of the driving arms and the Coriolis force is made to act upon that vibrating detecting arm, in principle, for example, a pair of detecting arms are arranged line symmetrical relative to the center between the pair of driving arms or one driving arm and one detecting arm are arranged like a tuning fork.

Further, in the present embodiment, the piezoelectric body 3 has only one pair of driving arms 7 as arms extending from the frame 5 and vibrating by application of voltage (as will be explained later, it is also possible to provide another driving arm 7 extending alongside the pair of driving arms 7). That is, no other driving arm which extends from the frame 5 to the side opposite to the driving arms 7 (negative side in the y-axis direction in the example shown) is provided.

Accordingly, for example, flexural deformation can be reliably caused in the frame 5 by the pair of driving arms 7. Note that, in a comparative example in which the detecting arm is positioned at the center of the pair of driving arms (see Patent Literature 1), for example, provision is made of another pair of driving arms which extend to the side opposite to the pair of driving arms so as not to cause flexing as in the present embodiment in the part corresponding to the frame 5, and the other pair of driving arms are excited with the same phase as that of the pair of driving arms.

Second Embodiment

Figure 6:
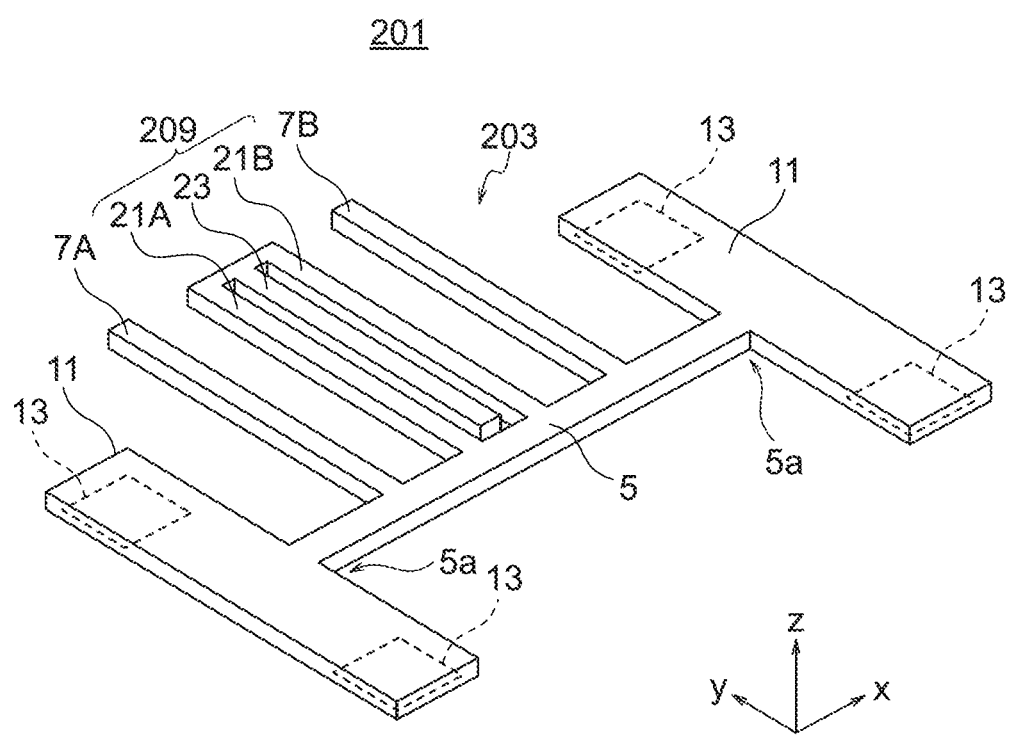
FIG. 6 is a perspective view showing a piezoelectric body in a sensor element according to a second embodiment.

FIG. 6 is a view, similar to FIG. 1, showing the configuration of a sensor element 201 according to a second embodiment.

The sensor element 210 (piezoelectric body 203) differs from the sensor element 1 (piezoelectric body 3) in the first embodiment in the configuration of the detecting arm. Further, along with the difference, the connection relationships of the detecting electrodes 17 by the wirings 19 also differ. The rest of the configuration is the same as in the first embodiment. Specifically, this is as follows.

A detecting arm 209 in the present embodiment, in the same way as the detecting arm 9 in the first embodiment, has first arms 21 extending from a frame 5 and a second arm 23 connected to the front end side portions of the first arms 21 and extending from the front end sides of the first arms 21 toward the frame 5. However, in contrast to the first embodiment in which one first arm 21 and two second arms 23 were provided, in the present embodiment, two first arms 21 (21A and 21B) and one second arm 23 are provided.

The pair of first arms 21 are for example provided with line symmetrical positions and shapes relative to a not shown symmetrical axis which passes through the center of the pair of driving arms 7 and is parallel to the y-axis. The second arm 23 is for example positioned between the pair of first arms 21 and is connected to the front end side portions of the both of the pair of first arms 21. Note that, the detecting arm 209 having such first arms 21 and second arm 23 is one example of a detecting arm which is positioned at the center between a pair of driving arms 7 in the same way as the detecting arm 9 in the first embodiment.

The configurations of the first arms 21 and second arm 23 and the configurations of the connection portions connecting them may be the same as those in the first embodiment. Naturally, specific dimensions may be different from those in the first embodiment in accordance with differences of the numbers and arrangement of the first arms 21 and second arms 23.

The shapes, arrangement, and connection relationships of the plurality of detecting electrodes 17 in each of the first arms 21 and second arm 23 may be the same as those in the first embodiment. In the present embodiment, however, corresponding to the fact that there are two first arms 21, between the two first arms 21, the detecting electrodes 17A are connected to each other, and the detecting electrodes 17B are connected to each other. The connections are for example carried out by wirings 19. Note that, between the first arms 21 and the second arm 23, in the same way as the first embodiment, the detecting electrodes 17A and the detecting electrodes 17B are connected by wirings 19. Also, the connection of the plurality of detecting electrodes 17 divided into two sets with two pads 13 by the wirings 19 is the same as that in the first embodiment.

As apparent from the explanation of the configuration described above, the operations of the sensor element 201 and the angular velocity sensor including the sensor element 201 are basically the same as the operations of the sensor element 1 and angular velocity sensor 51 in the first embodiment. For example, a new mode of vibration in which the detecting arm 209 displaces in the y-axis direction due to vibration in the x-axis direction of the pair of driving arms 7 and the Coriolis force in the z-axis direction acts upon the detecting arm 209 according to the rotation around the x-axis is realized. Further, for example, the second arm 23 flexurally deforms so as to bend to the direction of the Coriolis force, and a moment acting to bend the first arms 21 to the side opposite from the direction of the Coriolis force acts from the second arm 23 to the first arms 21.

As described above, in the present embodiment as well, the detecting arm 209 has the first arms 21 and the second arm 23. Accordingly, the same effects as those by the first embodiment are exhibited. For example, by the moment acting to bend the first arms 21 to the inverse side from the direction of the Coriolis force acting from the second arm 23 to the first arms 21, a moment acting to cause deformation in the frame 5 (see the arrow y3 in FIG. 4) is reduced.

Further, in the present embodiment, the detecting arm 209 has only two first arms 21 and only one second arm 23 which is positioned between the two first arms 21.

Accordingly, for example, it is easy to increase the mass of the detecting arm 209 while maintaining the balance of the detecting arm 209. As a result, for example, entry of noise can be reduced. Further, for example, the moment acting to bend the first arms 21 to the inverse side from the direction of the Coriolis force is reliably transferred to the frame 5 by the two first arms 21 while the possibility of occurrence of stress concentration can be reduced.

Third Embodiment (Sensor Element)

Figure 7A:
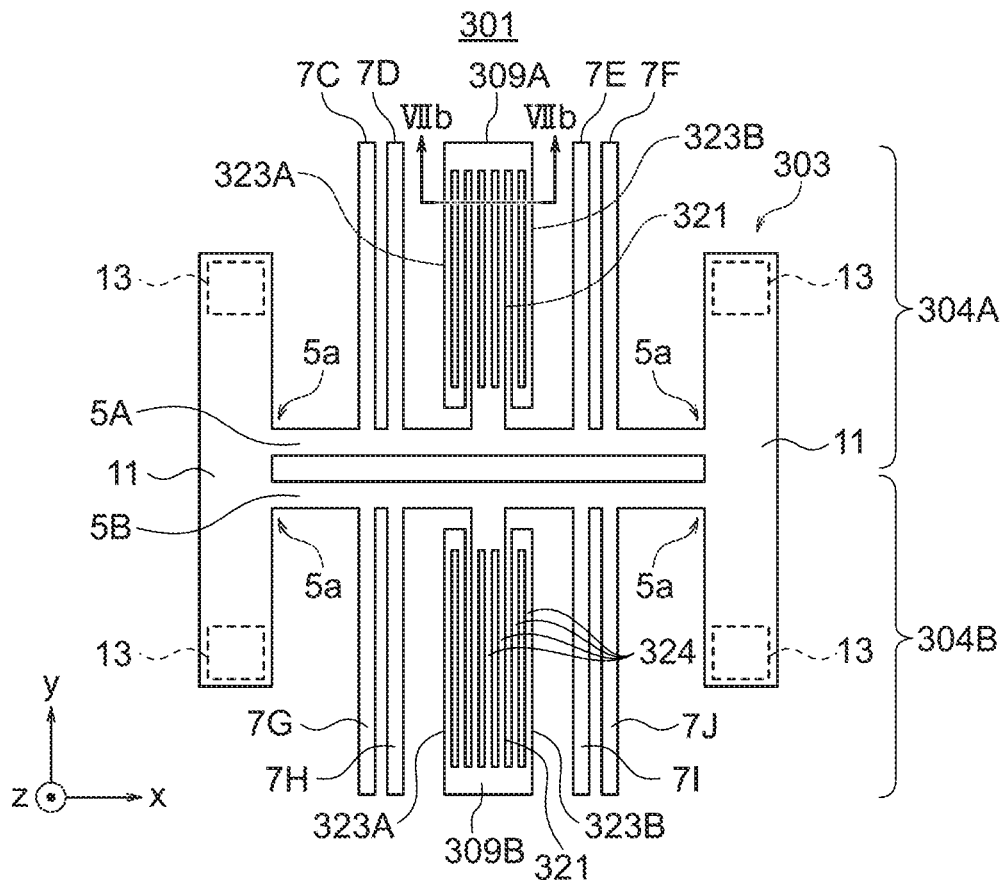
FIG. 7A is a plan view showing the configuration of a sensor element according to a third embodiment.

FIG. 7A is a plan view showing the configuration of a sensor element 301 according to a third embodiment. However, in this view, illustration of the conductive layer provided on the surface of the sensor element 301 is basically omitted.

The piezoelectric body 303 in the sensor element 301 is shaped as if two piezoelectric bodies 3 in the first embodiment were combined. That is, the piezoelectric body 303 has two units 304A and 304B. Each unit 304 has a frame 5, at least one pair of (two pairs in the present embodiment) driving arms 7 (7C to 7J) which extend from the frame 5 alongside each other in the y-axis direction, and a detecting arm 309 (309A and 309B).

The two units 304 are arranged so as to make the sides opposite from the directions of extension of the driving arms 7 and detecting arms 309 face each other and are supported upon a common pair of mounting parts 11. The distance between the two units 304 for example may be suitably set so that the frames 5A and 5B do not contact each other. The two units 304 are for example the same shape and size (have line symmetrically shapes and sizes relative to a not shown symmetrical axis parallel to the x-axis).

(Driving Arms)

Further, the piezoelectric body 3 in the first embodiment had one pair of driving arms 7 with respect to one frame 5. However, each of the units 304 in the piezoelectric body 303 has two pairs of driving arms 7 with respect to one frame 5. As will be explained later (FIG. 8A and FIG. 8B), two mutually neighboring driving arms 7 (two of 7C and 7D, two of 7E and 7F, two of 7G and 7H, and two of 7I and 7J) are supplied with voltages with the same phase so as to bend together to the same sides of the x-axis direction relative to each other. Accordingly, the two mutually neighboring driving arms 7 may be interpreted as corresponding to one driving arm 7 in the first embodiment. By dividing the driving arm 7 in the first embodiment into two in this way, for example, even if the length of the driving arms 7 is made short, the mass of the driving arms 7 as a whole can be secured and in turn both reduction of size and improvement of the detection sensitivity can be made achieved.

The position at the center between the two mutually neighboring driving arms 7 (or position of each of the driving arms 7) may be for example made the same as the positions of the driving arms 7 explained in the first embodiment. The distance between the two mutually neighboring driving arms 7 may be suitably set. The configurations of the two mutually neighboring driving arms 7 are for example the same as each other. However, they may be different from each other as well. The piezoelectric body 303 for example has a line symmetrical shape relative to a not shown symmetrical axis (detecting arms 309). The shapes and arrangement of the plurality of driving arms 7 are line symmetrical.

(Detecting Arms)

Each of the detecting arms 309, in the same way as the detecting arm 9 in the first embodiment, has the first arm 321 extending from the frame 5 and the second arms 323 (323A and 323B) which are connected to the front end side portions of the first arm 321 and extend from the front end side of the first arms 321 toward the frame 5 side. However, at least one (both in the present embodiment) of the first arm 321 and the second arms 323 have one or more via grooves (notation is omitted) which penetrate through in the z-axis direction and extend along each of the arms. From another viewpoint, each of the first arm 321 and second arms 323 has a plurality of divided arms 324 which extend alongside each other and are connected to each other at their roots and front ends.

The configurations of the detecting arms 309, first arms 321, and second arms 323 may be the same as the configurations of the detecting arm 9, first arm 21, and second arms 23 in the first embodiment except that the via grooves are provided. However, specific dimensions etc. may be different from those in the first embodiment due to the provision of the via grooves.

The number, widths, and intervals of the divided arms 324 in each of the first arms 321 and second arms 323 may be suitably set. The widths of the plurality of divided arms 324 may be the same as each other among the plurality of divided arms 324 (example shown) or may be different. If there are a plurality of intervals of the plurality of divided arms 324, the plurality of intervals may be the same as each other among the plurality of divided arms 324 (first arm 321 in the example shown) or may be different.

(Excitation Electrodes, Detecting Electrodes, and Wirings)

Although not particularly shown, in each of the driving arms 7, for example, in the same way as the driving arms 7 in the first embodiment, two excitation electrodes 15A and two excitation electrodes 15B are provided. Also, the connection relationships of the excitation electrodes 15 in each of the driving arms 7 by the wirings 19 are the same as those in the first embodiment.

The two mutually neighboring driving arms 7 correspond to one driving arm 7 in the first embodiment and are supplied with voltages with the same phases as each other. Therefore, between these two driving arms 7, the excitation electrodes 15A are rendered the same potentials as each other, and the excitation electrodes 15B are rendered the same potentials as each other.

In each of the units 304, the two driving arms 7 which are arranged line symmetrically while sandwiching the detecting arm 309 therebetween correspond to the pair of driving arms 7 in the first embodiment. Therefore, between these two driving arms 7, the excitation electrodes 15A and the excitation electrodes 15B are rendered the same potential.

When focusing on the two units 304, in the driving arms 7 (7C, 7D, 7G, and 7H, or 7E, 7F, 7I, and 7J) which are positioned on the same sides of the detecting arms 309 in the x-axis direction, the excitation electrodes 15A are rendered the same potentials as each other, and the excitation electrodes 15B are rendered the same potentials as each other. Accordingly, if AC voltage is supplied to the plurality of excitation electrodes 15, the driving arms 7 which are positioned on the same side of the detecting arms 309 in the x-axis direction vibrate so as to bend to the same sides as each other in the x-axis direction.

The excitation electrodes 15 to be rendered the same potentials as each other are for example connected to each other by the wirings 19. Further, all excitation electrodes 15 divided into two sets are connected through the wirings 19 to two among the four pads 13 and in turn connected to the driving circuit 103.

Figure 7B:
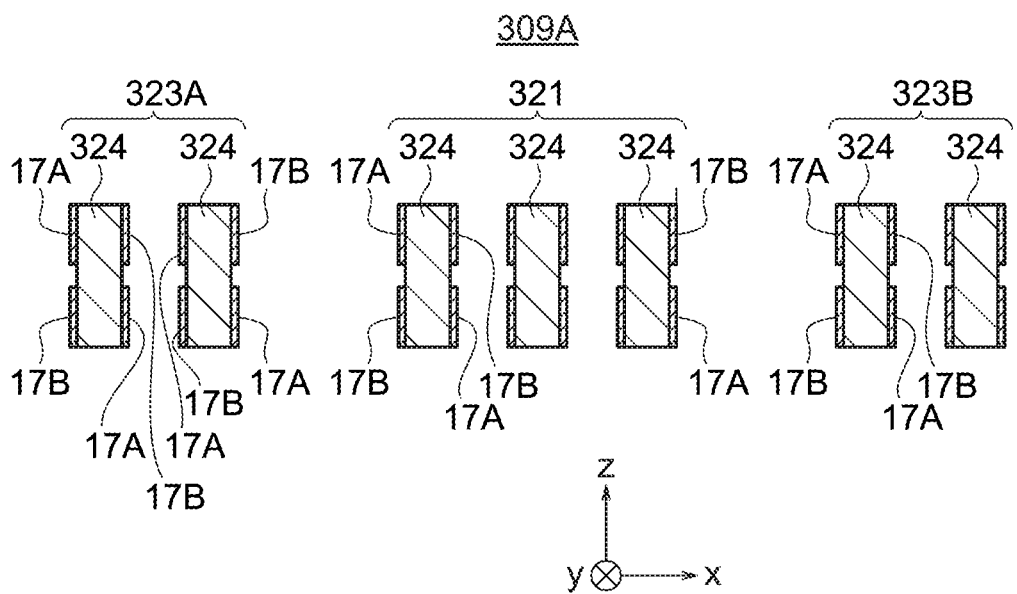
FIG. 7B is a cross-sectional view taken along the VIIb-VIIb line in FIG. 7A.

FIG. 7B is a cross-sectional view taken along the VIIb-VIIb line in FIG. 7A.

In the detecting arms 309, the detecting electrodes 17 are provided on each of the divided arms 324 in the same arrangement as the arrangement of the detecting electrodes 17 in the first arm 21 and second arms 23 in the first embodiment. That is, the detecting electrodes 17A on each of the divided arms 324 are provided in the region of +z in the side surface of −x and the region of −z in the side surface of +x. The detecting electrodes 17B on each of the divided arms 324 are provided in the region of −z in the side surface of −x and the region of +z in the side surface of +x.

Although not particularly shown, the connection relationships of the detecting electrodes 17 on each of the divided arms 324 is the same as the connection relationships of the detecting electrodes 17 in each of the first arm 21 and second arms 23 in the first embodiment. That is, the detecting electrodes 17A are connected to each other, and the detecting electrodes 17B are connected to each other. Due to this, each of the divided arms 324, in the same way as the first arm 21 and second arms 23, can output signal in accordance with the bending deformation to the z-axis direction.

Further, although not particularly shown, in each of the first arms 321, the plurality of detecting electrodes 17 are connected so that the entirety including the plurality of divided arms 324 function in the same way as the first arm 21 in the first embodiment. That is, among the plurality of divided arms 324, the detecting electrodes 17A are connected to each other, and the detecting electrodes 17B are connected to each other. The same is true for the second arms 323.

In each of the detecting arms 309, the first arm 321 and second arms 323 correspond to the first arm 21 and second arms 23 in the first embodiment. Therefore, although not particularly shown, between the first arm 321 and the second arms 323, the detecting electrodes 17A and the detecting electrodes 17B are connected. That is, when the first arm 321 and the second arms 323 flexurally deform so as to bend to inverse sides from each other in the z-axis direction, the detection signals are added.

Between the detecting arm 309A and the detecting arm 309B, the detecting electrodes 17A and the detecting electrodes 17B are connected. In such connection relationships, at the time when the detecting arms 309A and 309B receive Coriolis forces to inverse sides from each other in the z-axis direction and flexurally deform, the signals generated in the two are added.

The plurality of detecting electrodes 17 are for example connected by the wirings 19. All of the detecting electrodes 17 divided into the two sets are connected to two among the four pads 13 by the wirings 19 and in turn connected to the detecting circuit 105.

(Operation of Angular Velocity Sensor)

Figure 8A:
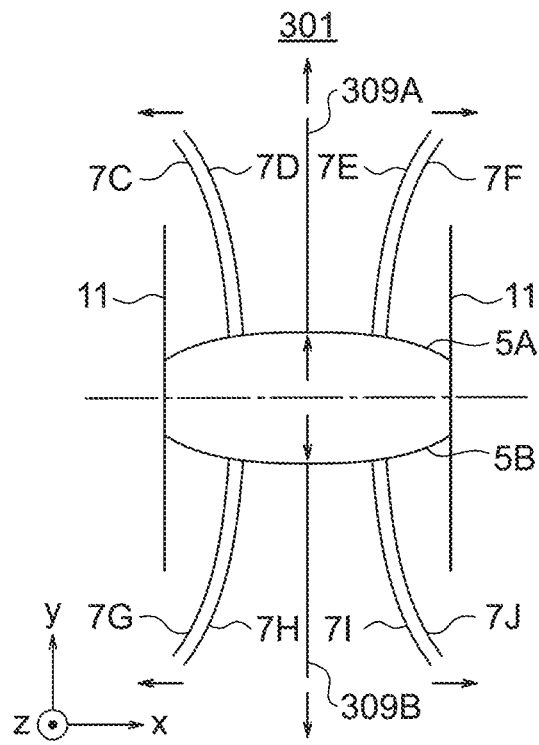
FIG. 8A, FIG. 8B, FIG. 8C, and FIG. 8D are schematic views for explaining the mode of operation of the sensor element in FIG. 7A.
Figure 8B:
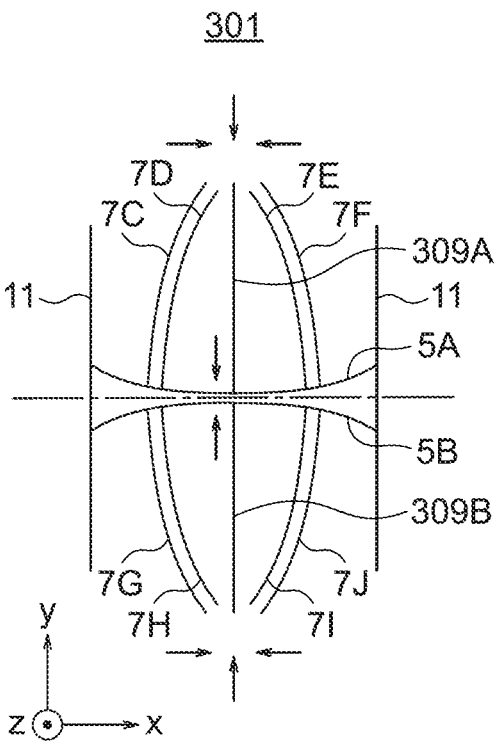

FIG. 8A and FIG. 8B are schematic plan views showing the excitation state of the piezoelectric body 303 and correspond to FIG. 4A and FIG. 4B in the first embodiment. In these views, the detecting arms 309, for convenience of explanation, are schematically shown as if they were a single arm.

The excitation in each of the units 304 is basically the same as the excitation of the piezoelectric body 3 in the first embodiment. However, as already explained, in each of the units 304, two driving arms 7 neighboring each other are supplied with voltages with the same phase so as to bend to the same sides relative to each other together, therefore correspond to one driving arm 7 in the piezoelectric body 3.

As described above, when focusing on the two units 304, between the driving arms 7 which are positioned on the same sides of the detecting arms 309 in the x-axis direction (positive side or negative side), the excitation electrodes 15A are connected to each other and the excitation electrodes 15B are connected to each other. Therefore, the driving arms 7 positioned on the same side are supplied with voltages with the same phase, so bend to the same side in the x-axis direction. Accordingly, the frames 5A and 5B warp to inverse sides from each other. Further, the detecting arms 309A and 309B displace to inverse sides from each other.

Figure 8C:
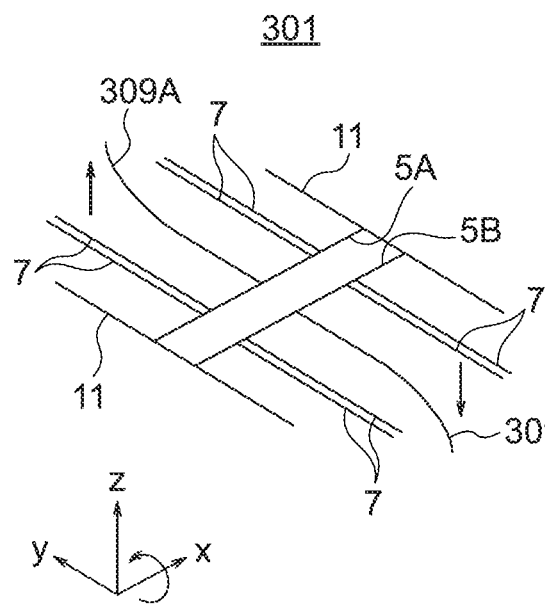
Figure 8D:
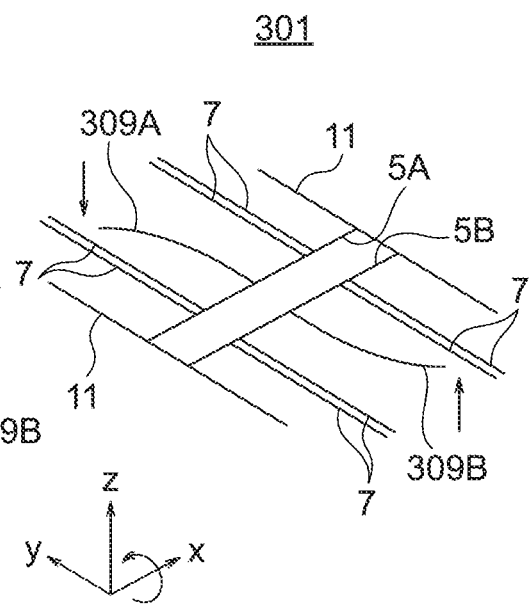

FIG. 8C and FIG. 8D are schematic perspective views for explaining vibrations of the detecting arms 309 due to the Coriolis force and correspond to the states in FIG. 8A and FIG. 8B. Here, for convenience of explanation, the detecting arms 309 are schematically shown as if they were a single arm as well.

When the sensor element 301 is rotated around the x-axis in the state where vibrations explained with reference to FIG. 8A and FIG. 8B occur, in each of the units 304, in the same way as the first embodiment, the detecting arm 309 vibrates in the z-axis direction due to the Coriolis force. At this time, the detecting arms 309A and 309B vibrate with phases displacing to inverse sides from each other in the y-axis direction, therefore they receive the Coriolis force on the same side relative to the rotation direction around the x-axis. From another viewpoint, the detecting arms 309A and 309B vibrate so as to bend to inverse sides from each other in the z-axis direction.

Further, the signal (voltages) generated due to deformation of each of the detecting arms 309 is extracted by the detecting electrodes 17. The signals extracted in the pair of detecting arms 309 are added and output from the pads 13.

As described above, the sensor element 301 according to the third embodiment includes the units 304 corresponding to the sensor element 1 in the first embodiment. Accordingly, the same effects as those by the first embodiment are exhibited. For example, by the moment acting to bend the first arms 321 to the inverse side from the direction of the Coriolis force acting from the second arms 323 to the first arms 321, the moment acting to make the frames 5 torsionally deform (see the arrow y3 in FIG. 4) is reduced.

Further, in the present embodiment, the piezoelectric body 303 has two sets of the combinations (has the two units 304) each having a frame 5, (at least) one pair of driving arms 7, and a detecting arm 309 so that the sides of the frames 5 opposite to the sides where the pairs of driving arms 7 extend outward are made to face each other.

Accordingly, for example, by adding the signals detected in the two detecting arms 309, the detection sensitivity can be improved. Further, for example, in the first embodiment, the region between the pair of mounting parts 11 and on the negative side in the y-axis direction becomes a dead space. However, such a space is effectively utilized. As a result, improvement of sensitivity and reduction of size are both realized.

Fourth Embodiment

Figure 9:
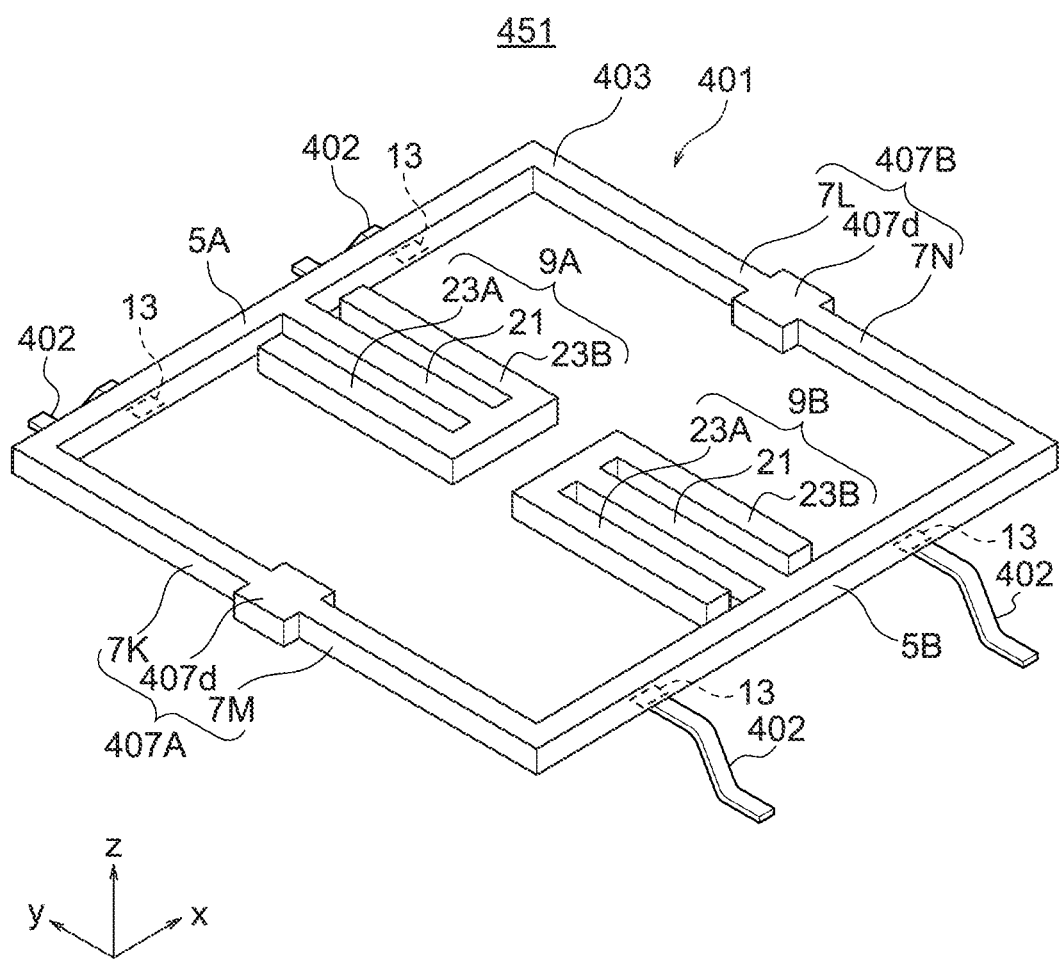
FIG. 9 is a perspective view showing a piezoelectric body in a sensor element according to a fourth embodiment.

FIG. 9 is a perspective view showing the configuration of an angular velocity sensor 451 (particularly sensor element 401) according to a fourth embodiment. However, in this view, illustration of the conductive layer provided on the surface of the sensor element 401 is basically omitted.

The sensor element 401, in the same way as the sensor element 301 in the third embodiment, can be grasped as one having two sensor elements 1 of the first embodiment. However, the sensor element 301 is configured so that the sides of the sensor elements 1 (units 304) opposite to the sides where the driving arms 7 extend outward are made to face each other. In contrast to this, the sensor element 401 is configured so that the sides of the sensor elements 1 where the driving arms 7 extend outward are made to face each other. Further, in the sensor element 401, no mounting part 11 is provided. The configuration of the sensor element 401 (angular velocity sensor 451) is specifically as follows.

The angular velocity sensor 451 for example has a sensor element 401 and a plurality of (four in the example shown) terminals 402 which support the sensor element 401. The sensor element 401 has a piezoelectric body 403.

(Shape of Piezoelectric Body)

The material and polarization direction of the piezoelectric body 403 are the same as those of the piezoelectric body 3 in the first embodiment. Further, the piezoelectric body 403, for example, in the same way as the piezoelectric body 3, is integrally formed as a whole, and its thickness (z-axis direction) is constant. Further, the piezoelectric body 403, for example, is formed in a shape line symmetrical relative to a not shown symmetrical axis parallel to the y-axis and line symmetrical relative to a not shown symmetrical axis parallel to the x-axis.

The piezoelectric body 403 for example has a pair of frames 5 (5A and 5B), a pair of driving arms 407 (407A and 407B) which are arranged bridging the pair of frames 5, and a pair of detecting arms 9 (9A and 9B) extending from the pair of frames 5.

The pair of frames 5 face each other in the y-axis direction. The configuration of each of the frames 5 may be the same as the first embodiment. The natural frequency of the flexural deformation of the frames 5 may be adjusted so as to become closer to the natural frequency of the driving arms 407 in the direction of excitation by application of voltage and/or the natural frequency of the detecting arms 9 in the direction of vibration due to the Coriolis force in the same way as in the first embodiment.

The pair of driving arms 407 are arranged bridging the pair of frames 5 and face each other in the x-axis direction. Accordingly, the pair of frames 5 and pair of driving arms 407 configure a frame shape (annular shape) surrounding an opening as a whole. The driving arms 407 are for example long shapes linearly extending in the y-axis direction. The pair of frames 5 and the pair of driving arms 407 are for example connected to each other at their two ends and configure a rectangle.

Note that, each of the driving arms 407 can be grasped as vertically connected driving arms 7 of the first embodiment. That is, it can be grasped that the driving arms 7K and 7L extending from the frame 5A correspond to the driving arms 7A and 7B. In the same way, it can be grasped that the driving arms 7M and 7N extending from the frame 5B correspond to the driving arms 7A and 7B. Further, the front end of the driving arm 7K and the front end of the driving arm 7M are connected, and the front end of the driving arm 7L and the front end of the driving arm 7N are connected.

The configuration of each of the driving arms 7 may be the same as the first embodiment. Further, as illustrated, the portions connecting the front ends of the driving arms 7 to each other are formed as broad width portions 407d which are broader in widths than the driving arms 7. Note that, such broad width portions 407d need not be provided either.

The pair of detecting arms 9 are for example positioned on the inner side of the pair of frames 5 (between the pair of frames 5). The configuration of each of the detecting arms 9 may be the same as the first embodiment.

(Pads and Terminals)

The plurality of terminals 402 are for mounting the sensor element 401 on a not shown mounting body (for example a portion of a package or a circuit board). The plurality of terminals 402 are for example configured so as to resiliently support the sensor element 401 to permit parallel movement and/or rotational movement of the joined positions of the plurality of terminals 402 and the sensor element 401 and in turn so that vibration of the piezoelectric body 403 which will be explained later is enabled. In the example shown, the terminals 402 are formed by long pieces of sheet metal having relatively small thicknesses and widths and having suitable bending portions.

The sensor element 401 is for example arranged with its lower surface facing a not shown mounting body. The plurality of terminals 402 are for example joined at one end side portions with the plurality of pads 13 which are provided on the surface (for example lower surface) of the piezoelectric body 403 and are joined at the other end side portions with pads on the not shown mounting body. Due to this, the sensor element 401 and the mounting body are electrically connected, and the sensor element 401 (piezoelectric body 403) is supported in a state enabling vibration.

The positions of the plurality of pads 13 on the piezoelectric body 403 may be suitably set. In the example shown, a mode where the four pads 13 are provided on the pair of frames (two sides) is shown. Other than this, for example, four pads 13 may be provided on the pair of driving arms 407 (two sides), four pads 13 may be provided on the pair of frames 5 and pair of driving arms 407 (four sides), or four pads 13 may be provided at the four corner portions formed by the pair of frames 5 and pair of driving arms 407.

(Excitation Electrodes, Detecting Electrodes, and Wirings)

As explained above, the driving arms 7K and 7L correspond to the driving arms 7A and 7B in the first embodiment. Accordingly, although not particularly shown, on the driving arms 7K and 7L, in the same way as the driving arms 7A and 7B in the first embodiment, a plurality of excitation electrodes 15 are arranged and are connected. The same is true for the driving arms 7M and 7N.

When focusing on each of the driving arms 407, between the two driving arms 7 (7K and 7M, or 7L and 7N) which are connected at the front ends to each other, the excitation electrodes 15A are rendered the same potentials as each other, and the excitation electrodes 15B are rendered the same potentials as each other. Accordingly, when AC voltages are supplied to the plurality of excitation electrodes 15, in each of the driving arms 407, the two driving arms 7 flexurally deform so as to bend to the same sides in the x-axis direction as each other.

Although not particularly shown, in each of the driving arms 407, over substantially the entirety of its long direction (without differentiating between the two driving arms 7), a pair of excitation electrodes 15A and/or a pair of excitation electrodes 15B may be provided as well. For example, four excitation electrodes 15 may be provided for one driving arm 407. In particular, in a mode where no broad width portions 407d are provided, formation of excitation electrodes 15 covering the entirety of the long direction of each of the driving arms 407 is easy.

As will be understood from the above description, in the explanation of the excitation electrodes 15, it is not always necessary to differentiate whether the excitation electrodes 15 are provided for each of the driving arms 7 in the driving arms 407. In the following description, even if the pair of excitation electrodes 15A and pair of excitation electrodes 15B are provided for each of the driving arms 7, sometimes it will be expressed that the pair of excitation electrodes 15A and the pair of excitation electrodes 15B are provided on one driving arm 407.

The excitation electrodes 15 which must be given the same potential are for example connected to each other by the wirings 19. Further, all of the excitation electrodes 15 divided into two sets are connected through the wirings 19 to two among the four pads 13 and in turn connected to the driving circuit 103.

The detecting arms 9 (9A and 9B) are the same as the detecting arm 9 in the first embodiment. Accordingly, the arrangement and connection relationships of the detecting electrodes 17 in each of the detecting arms 9 are the same as those in the first embodiment.

Between the pair of detecting arms 9, in the same way as the third embodiment, the detecting electrode 17A and the detecting electrodes 17B are connected. Accordingly, when the pair of detecting arms 9 vibrate so as to be deformed to inverse sides from each other about the z-axis direction, the signals generated in the two are added.

The plurality of detecting electrodes 17 are for example connected by the wirings 19. All of the detecting electrodes 17 divided into the two sets are connected to two among the four pads 13 by the wirings 19 and in turn connected to the detecting circuit 105.

(Operation of Angular Velocity Sensor)

FIG. 10A and FIG. 10B are schematic plan views for explaining excitation of the piezoelectric body 403. In these views, the entireties of the detecting arms 9 are schematically shown as single arms without differentiating between the first arms 21 and the second arms 23. Between FIG. 10A and FIG. 10B, the phases of the AC voltages supplied to the excitation electrodes 15 are offset by 180° from each other.

Between the pair of driving arms 407, the excitation electrode 15A and the excitation electrode 15B are rendered the same potential. Therefore, when the AC voltages are supplied to the excitation electrodes 15, the pair of driving arms 407 are excited with inverse phases from each other so as to flexurally deform to inverse sides from each other in the x-axis direction.

At this time, as shown in FIG. 10A, when a pair of driving arms 407 warp to the inner side of the pair of driving arms 407 in the x-axis direction, the bending moments thereof are transferred to the pair of frames 5, and the pair of frames 5 warp to the outer sides of the pair of frames 5 in the y-axis direction. As a result, the pair of detecting arms 9 displace to the outer sides of the pair of frames 5 in the y-axis direction.

Conversely, as shown in FIG. 10B, when a pair of driving arms 407 warp to the outer sides of the pair of driving arms 407 in the x-axis direction, the bending moments thereof are transferred to the pair of frames 5, and the pair of frames 5 warp to the inner sides of the pair of frames 5 in the y-axis direction. As a result, the pair of detecting arms 9 displace to the inner sides of the pair of frames 5 in the y-axis direction.

Accordingly, by excitation of the pair of driving arms 407, the pair of detecting arms 9 vibrate in the y-axis direction. Note that, in the first embodiment, the driving arms 7 were cantilever shaped. Therefore, in the x-axis direction, the front ends (free ends) displaced toward the sides being bent. In the present embodiment, however, the driving arms 407 are beam shaped with the two ends supported, therefore the center parts displace to the sides opposite to the sides of bending in the x-axis direction. Further, the relationships between the directions of bending of the driving arms 7 and the directions of bending of the frames 5 are inverse in the present embodiment relative to those in the first embodiment.

FIG. 10C and FIG. 10D are schematic perspective views for explaining vibrations of the pair of detecting arms 9 due to the Coriolis forces. In these views, the detecting arms 9 are schematically shown as single arms in their entireties without differentiating between the first arms 21 and the second arms 23. FIG. 10C and FIG. 10D correspond to the states in FIG. 10A and FIG. 10B.

When the sensor element 1 is rotated around the x-axis in the state where the piezoelectric body 403 is vibrating as explained with reference to FIG. 10A and FIG. 10B, the pair of detecting arms 9 vibrate (are deformed) in the direction (z-axis direction) perpendicular to the rotation axis (x-axis) and to the vibration direction (y-axis) due to the Coriolis forces since they are vibrating (displaced) in the y-axis direction.

Further, the pair of detecting arms 9 vibrate so as to displace to inverse sides from each other in the y-axis direction, therefore they displace to the same sides as each other about the rotation direction around the x-axis due to the Coriolis forces. From another viewpoint, the pair of detecting arms 9 displace to inverse sides from each other in the z-axis direction.

Further, the signal (voltages) generated due to deformation of each of the detecting arms 9 is extracted by the detecting electrodes 17. The signals extracted in the pair of detecting arms 9 are added and output from the pads 13.

As described above, in the fourth embodiment as well, the sensor element 401 has detecting arms 9 including the first arms 21 and second arms 23. Accordingly, the same effects as those by the first embodiment are exhibited. For example, by the moments acting to bend the first arms 21 to the inverse sides from the directions of the Coriolis forces acting from the second arms 23 to the first arms 21, the moments acting to cause deformation in the frames 5 (see the arrow y3 in FIG. 4) are reduced.

Further, in the present embodiment, the piezoelectric body 403 has the pair of frames 5, pair of driving arms 407, and pair of detecting arms 9. The pair of frames 5 have long shapes so that the two ends are separated in the x-axis direction and face each other in the y-axis direction. The pair of driving arms 407 are respectively arranged bridging the pair of frames 5 and face each other in the x-axis direction. The pair of detecting arms 9 extend from the pair of frames 5 in the y-axis direction at positions between the pair of driving arms 407 in the x-axis direction. The plurality of excitation electrodes 15 are provided in an arrangement capable of supplying voltages exciting the pair of driving arms 407 in the x-axis direction. The wirings 19 connect the plurality of excitation electrodes 15 in such connection relationships where voltages having inverse phases from each other vibrating the pair of driving arms 407 to inverse sides from each other in the x-axis direction are supplied from the plurality of excitation electrodes 15 to the pair of driving arms 407.

Accordingly, in the same way as the first to third embodiments, it becomes possible to perform new detection by a new mode of vibration of making the frames 5 flex (vibrate) by excitation of the pair of driving arms 407, making the detecting arms 9 displace (vibrate), and detecting the angular velocity due to the Coriolis forces acting upon these displacing detecting arms 9.

Further, when compared with the first to third embodiments, in the present embodiment, the two ends of each of the pair of driving arms 407 are connected to the pair of frames 5, and the detecting arm 9 is provided at each of the frames 5, therefore vibrations of the pair of driving arms 407 are efficiently transferred to the pair of detecting arms 9. As a result, for example, the detection sensitivity is improved.

Further, in the present embodiment, the pair of detecting arms 9 extend to the inner side of the pair of frames 5. That is, the pair of detecting arms 9 are positioned within the opening configured by the pair of frames 5 and pair of driving arms 407. Accordingly, for example, compared with the mode in which the detecting arms 9 extend to the outer sides of the pair of frames 5 (this mode also included in the present disclosure), the sensor element 1 is reduced in size.

Multi-Axis Angular Velocity Sensor (Overall Configuration)

Figure 11:
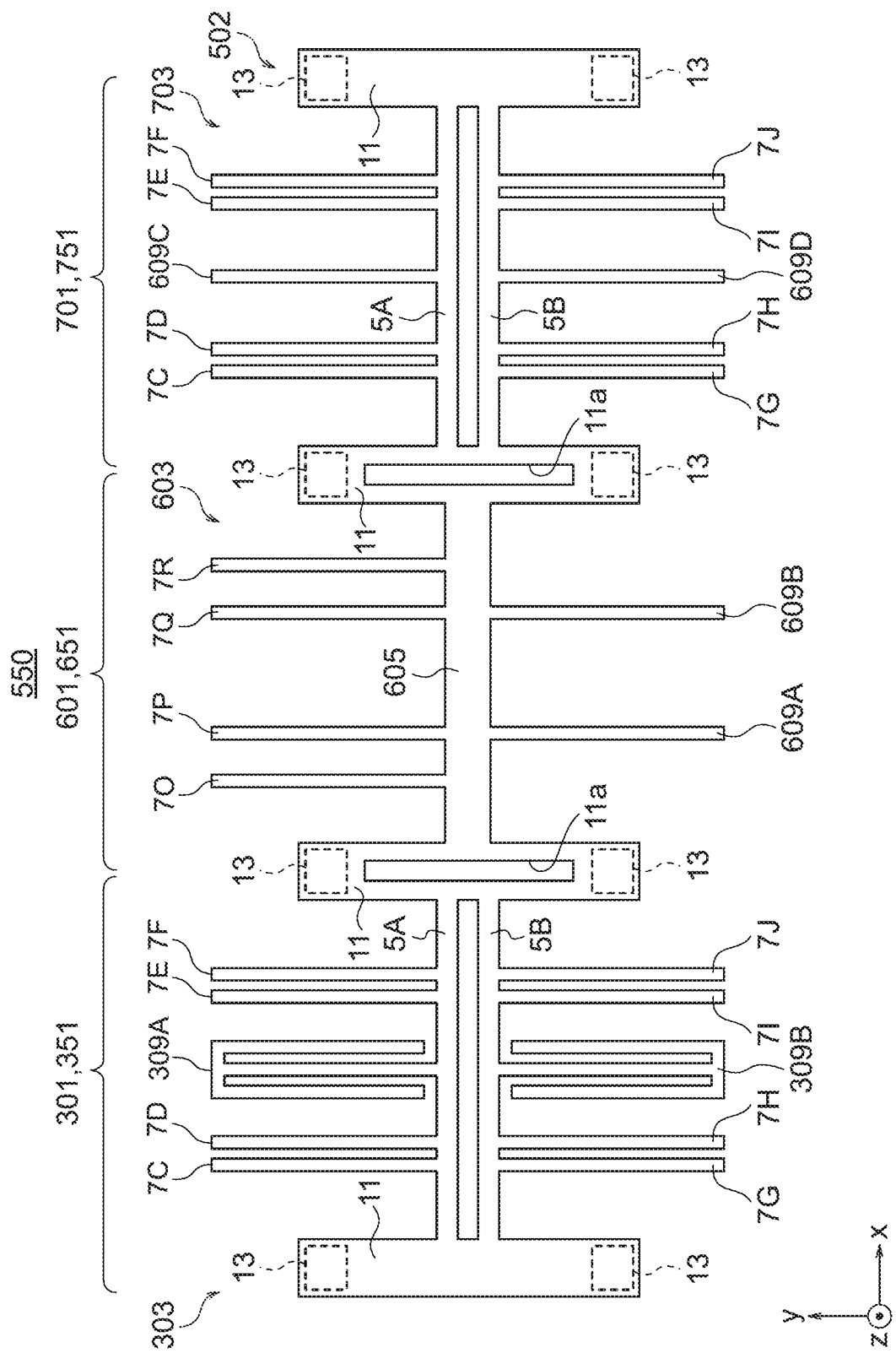
FIG. 11 is a plan view showing the configuration of a multi-axis angular velocity sensor.

FIG. 11 is a plan view showing the configuration of a multi-axis angular velocity sensor 550 including an angular velocity sensor explained above.

The multi-axis angular velocity sensor 550 for example has an x-axis sensor 351 which detects the angular velocity around the x-axis, a y-axis sensor 651 which detects the angular velocity around the y-axis, and a z-axis sensor 751 which detects the angular velocity around the z-axis. Note that, in the example shown, the angular velocity sensor according to the third embodiment is shown as the x-axis sensor 351. However, the x-axis sensor 351 may be replaced by an angular velocity sensor in the other embodiments explained above as well.

The x-axis sensor 351 for example has a sensor element 301, a driving circuit 103 (FIG. 3) supplying voltage to the sensor element 301, and a detecting circuit 105 (FIG. 3) detecting the signal from the sensor element 301. The configurations and operations of them are as already explained.

The y-axis sensor 651 for example has a sensor element 601, a driving circuit 103 (FIG. 3) supplying voltage to the sensor element 601, and a detecting circuit 105 (FIG. 3) detecting the signal from the sensor element 601.

The y-axis sensor 651 is for example a piezoelectric vibration type in the same way as the x-axis sensor 351. The sensor element 601 has a piezoelectric body 603. The piezoelectric body 603 for example has a base part 605, one or more driving arms 7 (7O to 7R) and one or more detecting arms 609 (609A and 609B) which are all supported upon the base part 605, and a pair of mounting parts 11 supporting the base part 605.

The z-axis sensor 751 for example has a sensor element 701, a driving circuit 103 (FIG. 3) supplying voltage to the sensor element 701, and a detecting circuit 105 (FIG. 3) detecting the signal from the sensor element 701.

The z-axis sensor 751, for example, in the same way as the x-axis sensor 351, is a piezoelectric vibration type. The sensor element 701 has a piezoelectric body 703. The piezoelectric body 703 is for example obtained by providing detecting arms 609C and 609D in place of the detecting arms 309A and 309B in the piezoelectric body 303 in the x-axis sensor 351.

The detecting arms 609 in the y-axis sensor 651 and z-axis sensor 751 are ones without the first arms 21 and second arms 23 unlike the detecting arms 9. That is, the detecting arms 609 are shaped to extend in single directions from the base parts 605.

The sensor element 301, sensor element 601, and sensor element 701 are for example arranged in the x-axis direction. Note that, the order of arrangement of the three sensor elements may be one other than the one shown as well. The piezoelectric bodies in these sensor elements are for example integrally formed and are fixed to each other. That is, the multi-axis angular velocity sensor 550 has a piezoelectric body 502 including the piezoelectric body 303 in the sensor element 301, the piezoelectric body 603 in the sensor element 601, and the piezoelectric body 703 in the sensor element 701. Specifically, for example, these piezoelectric bodies are fixed so that mutually neighboring ones share the mounting part 11. The piezoelectric body 502 has four mounting parts 11 in total.

Via holes 11a are formed in the mounting parts 11 which are shared by the piezoelectric bodies in two mutually neighboring sensor elements. The via holes 11a are for example slit-shaped so as to penetrate in the z-axis direction and extend in the y-axis direction (directions along the mounting parts 11) with substantially constant widths. The pads 13 are for example positioned on the outer sides of the via holes 11a in the y-axis direction. By formation of the via holes 11a, for example, mutual influences of vibrations of the sensor elements are mitigated.

Among the x-axis sensor 351, y-axis sensor 651, and z-axis sensor 751, the driving circuit 103 may be shared. From another viewpoint, the frequencies when exciting the piezoelectric bodies in these three angular velocity sensors may be made the same. At this time, the excitation-use pair of pads 13 may be shared among the three angular velocity sensors. Accordingly, the multi-axis angular velocity sensor 550 only has to include eight pads 13 in total including two detection-use pads 13 in each of the angular velocity sensors and the two excitation-use pads 13. In the example shown, the eight pads 13 are respectively provided at the end parts of the four mounting parts 11 which are shared as explained above. Note that, the driving circuit 103 need not be shared at part or all of the three angular velocity sensors either. In this case, over eight pads 13 may be positioned at suitable positions of the mounting parts 11. Further, in this case, the frequencies when exciting the piezoelectric bodies in the three angular velocity sensors may be different from each other or may be the same as each other.

(Y-Axis Sensor)

The y-axis sensor 651 may be configured in various ways including known ones. In the following description, one example thereof will be explained.

The piezoelectric body 603 has a base part 605, four (two pairs of) driving arms 7O, 7P, 7Q, and 7R, and two detecting arms 609A and 609B. The four driving arms 7 extend from the base part 605 toward one side (positive side in the example shown) in the y-axis direction. Further, they are configured line symmetrically relative to a not shown symmetrical axis parallel to the y-axis. The two detecting arms 609 extend from the base part 605 toward the side opposite to the driving arms 7.

Figure 12A:
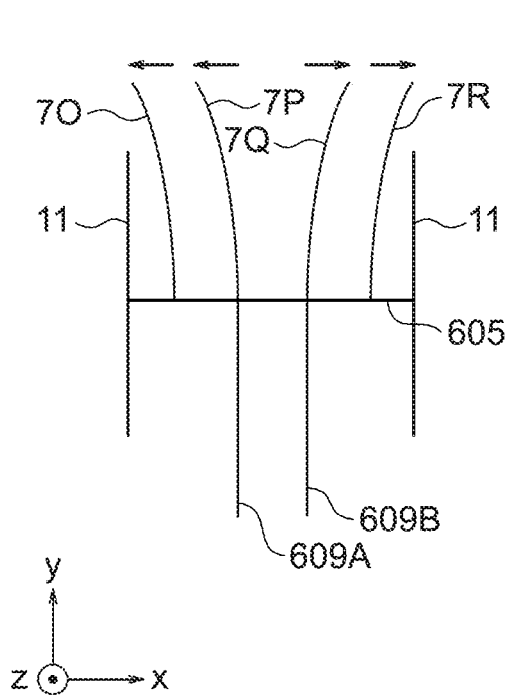
FIG. 12A, FIG. 12B, FIG. 12C, and FIG. 12D are schematic views for explaining the mode of operation of a y-axis sensor included in the multi-axis angular velocity sensor in FIG. 11.
Figure 12B:
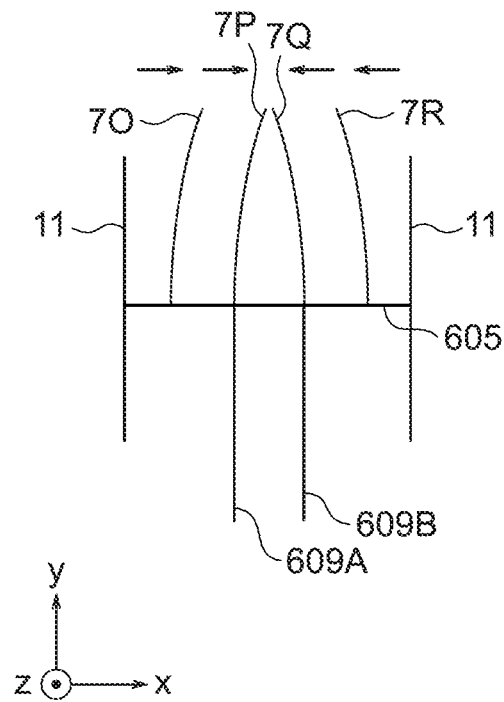

FIG. 12A and FIG. 12B are schematic plan views for explaining the excitation states of the piezoelectric body 603.

The four driving arms 7O, 7P, 7Q, and 7R, for example, in the same way as the driving arms 7C, 7D, 7E, and 7F in the third embodiment, are excited so that the two positioned on the same side (positive side or negative side) in the x-axis direction bend to the same sides as each other in the x-axis direction, and the two positioned on the positive side in the x-axis direction and the two positioned on the negative side in the x-axis direction bend to inverse sides from each other in the x-axis direction. Note that, due to the excitations of these driving arms 7, the base part 605 need not flex. Further, the detecting arms 609A and 609B need not vibrate.

As will be understood from the operation described above, the arrangement and connection of the excitation electrodes 15 in the piezoelectric body 603 may be the same as those in the third embodiment. Further, all of the excitation electrodes 15 which were divided into the two sets are connected to two pads 13 by the wirings 19 and in turn connected to the driving circuit 103.

Figure 12C:
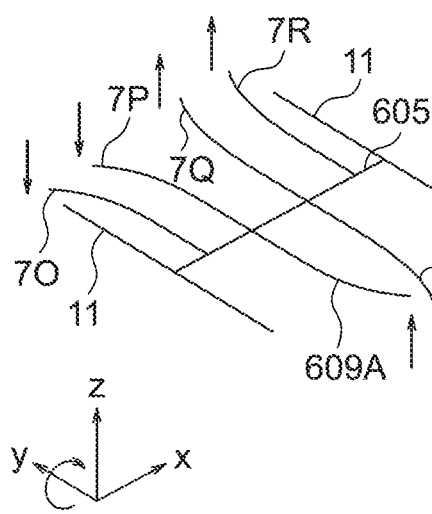
Figure 12D:
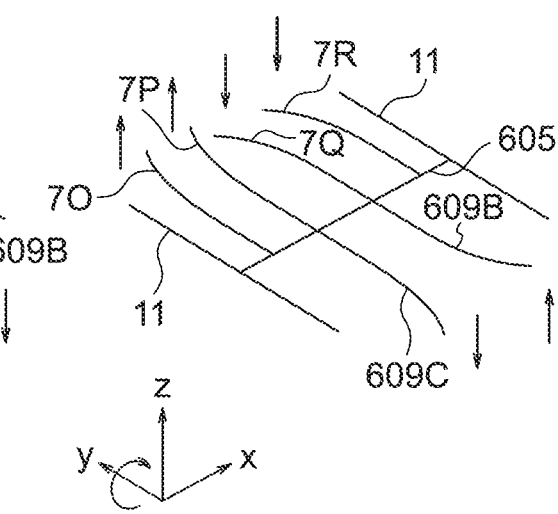

FIG. 12C and FIG. 12D are schematic perspective views for explaining vibrations due to the Coriolis forces of the piezoelectric body 603.

When the piezoelectric body 603 is rotated around the y-axis in the state where the driving arms 7 are made to vibrate as described above, upon the driving arms 7, the Coriolis force acts in the direction (z-axis direction) perpendicular to the vibration direction (x-axis direction) and to the rotation axis (y-axis). As a result, the driving arms 7 vibrate so as to flexurally deform in the z-axis direction. The driving arms 7O and 7P positioned on the negative side in the x-axis direction and the driving arms 7Q and 7R positioned on the positive side in the x-axis direction vibrate to inverse sides from each other in the x-axis direction, therefore they vibrate so as to bend to the same side around the rotation axis (around the y-axis). That is, the two vibrate so as to bend to inverse sides relative to each other in the z-axis direction.

The vibrations of these driving arms 7 in the z-axis direction are transferred through the base part 605 to the detecting arms 609A and 609B. Further, the detecting arms 609 vibrate so as to bend to the inverse side of the z-axis direction relative to the driving arms 7 positioned on the same side in the x-axis direction. Further, the two detecting arms 609 vibrate so as to bend to inverse sides from each other in the z-axis direction.

In order to extract the signals generated in such detecting arms 609, for example, in the detecting arms 609, provision is made of the detecting electrodes 17 (FIG. 3) provided on the first arm 21 or second arms 23 in the first embodiment. The arrangement and connection relationships of the detecting electrodes 17 on each of the detecting arms 609 are the same as those on the first arm 21 or second arms 23. Further, in order to add the signals of the two detecting arms 609 which bend to inverse sides from each other, between two detecting arms 609, the detecting electrodes 17A and the detecting electrodes 17B are connected by the wirings 19. Further, all of the detecting electrodes 17 divided into the two sets are connected to the two pads 13 by the wirings 19 and in turn connected to the detecting circuit 105.

The y-axis sensor, other than the configuration described above, for example, may be given various configurations such as the one disclosed in Japanese Patent Publication No. 2015-99130 having eight driving arms and two detecting arms, a tuning fork-shaped one having one driving arm and one detecting arm, and one having a pair of driving arms and pair of detecting arms which extend toward the same side of the y-axis direction. It may be one which does not have a mounting part and is mounted in the base part as well.

(Z-Axis Sensor)

The z-axis sensor 751, for example, in the same way as the x-axis sensor 351, utilizes a new mode of vibration of making the frames 5 flexurally deform in the y-axis direction due to the vibrations of the driving arms 7 in the x-axis direction, and making the detecting arms 609 vibrate (displace) in the y-axis direction by this. Accordingly, in the z-axis sensor 751, the arrangement and connection relationships of the excitation electrodes 15 may be the same as those in the x-axis sensor 351.

Figure 13A:
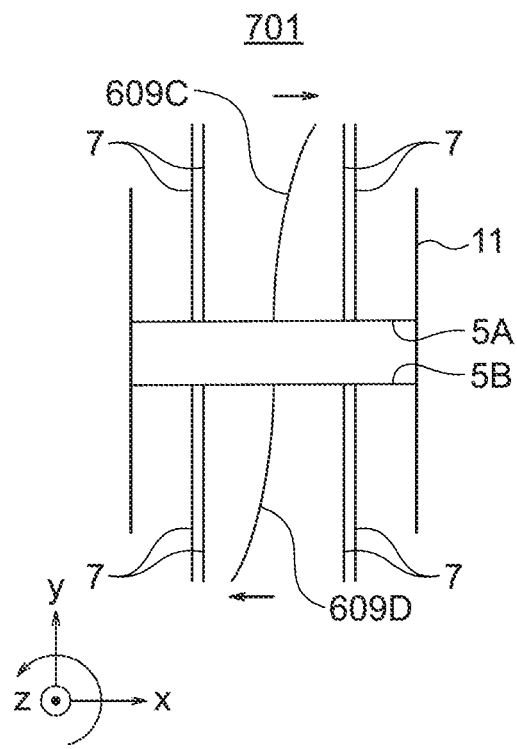
FIG. 13A and FIG. 13B are schematic views for explaining the mode of operation of a z-axis sensor included in the multi-axis angular velocity sensor in FIG. 11.
Figure 13B:
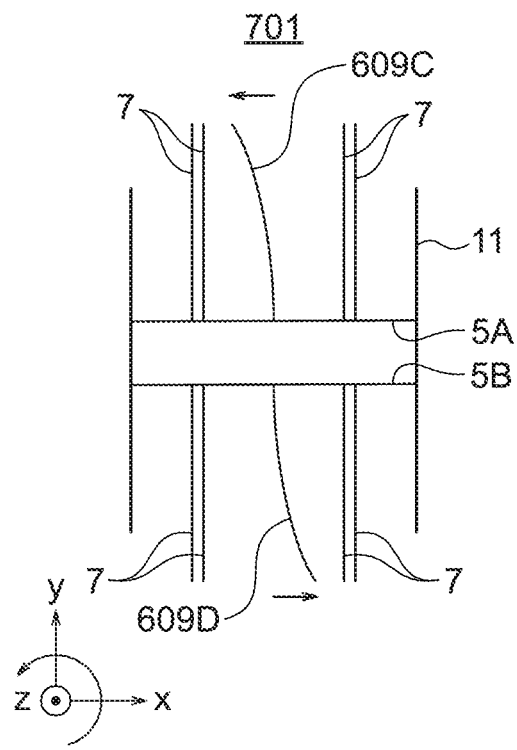

FIG. 13A and FIG. 13B are schematic plan views for explaining vibrations of the detecting arms 609 due to the Coriolis forces. FIG. 13A and FIG. 13B correspond to the states in FIG. 8A and FIG. 8B.

When the sensor element 701 is rotated around the z-axis in the state where vibrations explained with reference to FIG. 8A and FIG. 8B are caused, since the detecting arms 609 vibrate (are displaced) in the y-axis direction, they vibrate (displace) in the direction (x-axis direction) perpendicular to the rotation axis (z-axis) and to the vibration direction (y-axis direction) due to the Coriolis forces. Further, the pair of detecting arms 609 vibrate with phases for displacement to inverse sides from each other in the y-axis direction, therefore they receive the Coriolis forces on the same side relative to the rotation direction around the z-axis. From another viewpoint, the detecting arms 609A and 609B vibrate so as to bend to inverse sides from each other in the x-axis direction.

In order to extract the signals generated in such detecting arms 609, for example, in each detecting arm 609, although not particularly shown, provision is made of detecting electrodes having the same arrangement and connection relationships as those of the excitation electrodes 15 in the first embodiment (FIG. 3). Further, in order to add the signals of the two detecting arms 609 which bend to inverse sides from each other, between the two detecting arms 609, the detecting electrodes having the same arrangement as that of the excitation electrodes 15A and the detecting electrodes having the same arrangement as that of the excitation electrodes 15B are connected by the wirings 19. Further, all of the detecting electrodes divided into the two sets are connected to the two pads 13 by the wirings 19 and in turn connected to the detecting circuit 105.

Note that, the z-axis sensor 751 shown is based on the sensor in the third embodiment. However, it may be based on sensors in the other embodiments as well.

The present invention is not limited to the above embodiments and may be executed in various ways.

The sensor element (angular velocity sensor) is not limited to one detecting rotation around an axis perpendicular to the detecting arms (around the x-axis). The sensor element only have to be one generating a Coriolis force in a direction intersecting the plane including the first arms and second arms (plane parallel to the xy plane). For example, in the y-axis sensor 651 explained with reference to FIG. 11 and FIGS. 12, in place of the detecting arms 609, the detecting arms 9 having the first arm 21 and second arm 23 may be provided as well.

Further, as referred to also in the explanation of the embodiments, the sensor element is not limited to one utilizing the new mode of vibration of causing flexural deformation in the base part (frame 5) and is not limited to one having a long shaped base part in which flexural deformation tends to occur. In any mode of vibration and any shape of the base part, the same effects as those in the embodiments (reduction of the vibration energy escaping to the base part) or other effects are exhibited.

The embodiments illustrated sensor elements in which the detecting arms extend from one frame 5 (base part) toward only one side in the y-axis direction and in which a moment acting to cause torsional deformation in the base part due to the Coriolis force acting upon the detecting arms is applied. However, the sensor element may be made one where the moment as described above is not applied to the base part by extension of the detecting arms from one base part to the two sides of the y-axis direction as well.

For example, in the first embodiment, pairs of driving arms 7 and single detecting arms 9 may extend from the same frame 5 toward the two sides in the y-axis direction, so four driving arms 7 and two detecting arms 9 in total may be provided. Further, the phase of the pair of driving arms 7 on the positive side in the y-axis direction and the phase of the pair of driving arms 7 on the negative side in the y-axis direction may be made different by 180° as well. In this case, the two detecting arms 9 vibrate to the same sides as each other in the y-axis direction. Further, when the sensor element rotates around the x-axis, the Coriolis force acts upon the same side of the two detecting arms 9 in the z-axis direction.

Further, for example, in the fourth embodiment (FIG. 9), the detecting arms 9 may be provided not only on the inner side of the pair of frames 5, but also on the outer sides (four detecting arms 9 in total may be provided). In this case, when the sensor element rotates around the x-axis, the Coriolis force acts upon the two detecting arms 9 positioned on the two sides of one frame 5 in the y-axis direction toward the same side in the z-axis direction.

The detecting arms are not limited to ones provided at the centers between pairs of driving arms. This is clear also from the fact that a detecting arm having the first arm and second arm may be applied to the y-axis sensor as already explained and as the y-axis sensor, a tuning-fork type one and one having an even number of detecting arms arranged line symmetrically are known.

In the detecting arms, the numbers of the first arms and second arms may be suitably set. For example, the detecting arm may have only one first arm and only one second arm as well. From another viewpoint, one detecting arm need not be line symmetrically shaped either. Note that, for example, when an even number of detecting arms are provided line symmetrically, the symmetry of the entirety of the sensor element is secured even if one detecting arm is not line symmetrically shaped.

The embodiments illustrated a mode in which the first arm bent to the inverse side from the direction of the Coriolis force due to the moment acting from the second arms to the first arm. However, the first arm may receive the moment acting to bend it to the inverse side from the direction of the Coriolis force from the second arm, but may bend to the direction of the Coriolis force due to the Coriolis force which directly acts upon the first arm and the like. Even in this case, for example, the effect of reduction of the vibration energy transferred to the base part is still exhibited. Note that, the direction of bending of the first arm relative to the direction of the Coriolis force can be set by for example adjusting the masses of the first arm and second arms. For example, if the masses of the second arms are made relatively larger, the operation as in the embodiment is exhibited.

The driving arms and the detecting arms need not be parallel to each other either. Further, the first arms and the second arms need not be parallel to each other either. That is, the first arms and the second arms may be inclined from each other. The detecting electrodes may be provided on only one of the first arms and second arms.

The plurality of embodiments may be suitably combined. For example, the configuration of the third embodiment in which two or more driving arms (for example 7C and 7D) which are adjacent to each other are excited with the same phase as if they were one driving arm may be applied to the first embodiment or second embodiment as well. Further, for example, the configuration of forming grooves in the first arm and/or second arms in the third embodiment may be applied to the first, second, or fourth embodiment as well. The detecting arm in the third or fourth embodiment need not be one having one first arm and two second arms as in the first embodiment, but may be one having two first arms and one second arm as in the second embodiment.

In the case where the new mode of vibration explained in the embodiments is utilized, it is suitable to combine the number of the driving arms and the number of the detecting arms which extend from one frame. For example, with respect to one pair of driving arms, a detecting arm extending to the positive side in the y-axis direction and a detecting arm extending to the negative side in the y-axis direction may be provided as well. Further, between the pair of driving arms, two or more detecting arms extending alongside each other may be provided as well.

In the first to third embodiments, the piezoelectric body need not have a mounting part extending in the y-axis direction as shown in the embodiments. For example, the piezoelectric body may be mounted by providing a plurality of pads on the two ends of the frame as well. That is, in the frame, the portions provided with the pads may be made the supported portions as well.

Further, in the first to third embodiments, the piezoelectric body may be configured having (at least) a pair of driving arms extending toward one side of the y-axis direction and only one detecting arm positioned on the other side of the y-axis direction (shape like a two-prong fork). That is, the pair of driving arms and the detecting arm need to extend toward the same direction (alongside each other). Further, in the fourth embodiment, only detecting arms positioned on the outer sides of the pair of frames may be provided as well.

In the third embodiment (FIG. 7), the frame 5 sides of the two units 304 were made to face each other. However, conversely, the sides of the two units 304 opposite to the frames 5 may be made to face each other, and these two units 304 may be supported by a pair of mounting parts 11. Further, in the third embodiment, the two units 304 were excited with the same phases as each other. However, they may be excited with inverse phases from each other. Further, in the case where the frames 5 of the two units 304 are made to face each other as in the third embodiment, the two frames 5 may be respectively configured by portions of annular shapes, and the end parts of the annular shapes may be directly or indirectly connected to the mounting parts 11.

In the fourth embodiment (FIG. 9), the pair of frames and the pair of driving arms configured a rectangle. However, they may configure a hexagonal or octagonal or other ring shape as well.

The sensor element or angular velocity sensor may be configured as a portion of an MEMS (micro electromechanical system). In this case, a piezoelectric body configuring the sensor element may be mounted on a substrate of MEMS or a substrate of MEMS may be configured by a piezoelectric body and the piezoelectric body in the sensor element may be configured by a portion thereof.

The multi-axis angular velocity sensor may be one having only any two among the x-axis sensor, y-axis sensor, and z-axis sensor as well. In the embodiments, the piezoelectric bodies in the three angular velocity sensors were arranged in the x-axis direction. However, they may be arranged in the y-axis direction or may be arranged in an L-shape. Further, among the piezoelectric bodies in the three angular velocity sensors, only two need be fixed to each other or all may be separately formed and mounted in the same package or substrate.

REFERENCE SIGNS LIST

1 . . . sensor element, 3 . . . piezoelectric body, 5 . . . frame (base part), 7 . . . driving arm, 9 . . . detecting arm, 15 . . . excitation electrode, 17 . . . detecting electrode, 21 . . . first arm, and 23 . . . second arm.

The invention claimed is:

1. A sensor element, comprising:
a piezoelectric body which comprises
a base part and
a driving arm and a detecting arm which extend from the base part within a predetermined plane parallel to an xy plane in an orthogonal coordinate system xyz,
a plurality of excitation electrodes located on the driving arm,
a plurality of detecting electrodes which are located on the detecting arm in an arrangement enabling detection of a signal generated due to bending deformation of the detecting arm in the z-axis direction,
wherein the detecting arm comprises
a first arm extending from the base part within the predetermined plane and
a second arm which is connected to a front end side portion of the first arm, extends from a front end side of the first arm toward a base part side of the first arm within the predetermined plane, and comprises an end part on the base part side as a free end,
wherein at least part of the plurality of detecting electrodes are located on the second arm, and
wherein the plurality of detecting electrodes comprises a plurality of first electrodes located on the first arm and a plurality of second electrodes located on the second arm, and, among the plurality of first electrodes and the plurality of second electrodes, electrodes generating potentials having the same polarities as each other when the first arm and the second arms bend to inverse sides from each other in the z-axis direction are connected to each other.

2. The sensor element according claim 1, wherein the detecting arm comprises
the first arm and
a pair of second arms, including the second arm, located on lateral two sides of the first arm.

3. The sensor element according to claim 1, wherein the detecting arm comprises
a pair of first arms, including the first arm, extending alongside each other and the second arm located between the two first arms.

4. The sensor element according to claim 1, wherein:
the base part comprises a long shape so that its two ends are separated from each other in the x-axis direction,
the piezoelectric body comprises a pair of driving arms, including the driving arm, which extend from the base part alongside each other in the y-axis direction at positions where they are separated from each other in the x-axis direction,
the first arm extends from the base part in the y-axis direction at a position between the pair of driving arms in the x-axis direction,
the plurality of excitation electrodes are in an arrangement able to supply voltages exciting the pair of driving arms in the x-axis direction, and
the sensor element further comprises
a plurality of pads which are located in the piezoelectric body so as to be capable of supporting portions in the base part which are closer to two sides of the x-axis direction than the pair of driving arms, and
a plurality of wirings connecting the plurality of excitation electrodes in connection relationships where voltages having inverse phases from each other making the pair of driving arms vibrate to inverse sides from each other in the x-axis direction are supplied from the plurality of excitation electrodes to the pair of driving arms.

5. The sensor element according to claim 4, wherein the detecting arm is located at a center between the pair of driving arms.

6. The sensor element according to claim 4, wherein the piezoelectric body, as arms which extend from the base part and vibrate by application of voltage, comprises
only the pair of driving arms, or
only the pair of driving arms and one or more arms which extend alongside the pair of driving arms.

7. The sensor element according to claim 1, wherein:
the piezoelectric body comprises
a pair of base parts, including the base part, each comprising a long shape so that its two ends are separated in the x-axis direction, the base parts facing each other in the y-axis direction,
a pair of driving arms, including the driving arm, which are respectively arranged bridging the pair of base parts and face each other in the x-axis direction, and
a pair of detecting arms, including the detecting arm, which extend from the pair of base parts in the y-axis direction at such positions that are between the pair of driving arms in the x-axis direction,
the plurality of excitation electrodes are in an arrangement capable of supplying voltages exciting the pair of driving arms in the x-axis direction, and the sensor element further comprises a plurality of wirings connecting the plurality of excitation electrodes in such a connection relationships where voltages having inverse phases from each other making the pair of driving arms vibrate to inverse sides from each other in the x-axis direction are supplied from the plurality of excitation electrodes to the pair of driving arms.

8. The sensor element according to claim 1, wherein:
the plurality of excitation electrodes comprises
in each of a pair of driving arms including the driving arm, a pair of first excitation electrodes which are located on a pair of first surfaces facing two sides of the z-axis direction, and
in each of the pair of driving arms, a pair of second excitation electrodes which are located on a pair of second surfaces facing two sides of the x-axis direction,
the plurality of detecting electrodes comprises
in the first arm or the second arm, a pair of first detecting electrodes which are located on a third surface facing a negative side in the x-axis direction at a positive side in the z-axis direction from a center of the third surface and on a fourth surface facing a positive side in the x-axis direction at a negative side in the z-axis direction from a center of the fourth surface, and
a pair of second detecting electrodes on the third surface at the negative side in the z-axis direction from the center of the third surface and on the fourth surface at the positive side in the z-axis direction from the center of the fourth surface, and
the plurality of wirings connect the pair of first excitation electrodes on each of the pair of driving arms to each other, connect the pair of second excitation electrodes on each of the pair of driving arms to each other, connect the pair of first excitation electrodes and the pair of second excitation electrodes between the pair of driving arms, connect the pair of first detecting electrodes to each other, and connect the pair of second detecting electrodes to each other.

9. An angular velocity sensor, comprising
a sensor element according to claim 1,
a driving circuit which supplies voltages to the plurality of excitation electrodes, and
a detecting circuit which detects signals from the plurality of detecting electrodes.

10. A multi-axis angular velocity sensor, comprising
an x-axis sensor which detects an angular velocity around an x-axis in an orthogonal coordinate system xyz,
a y-axis sensor which detects an angular velocity around a y-axis, and
a z-axis sensor which detects an angular velocity around a z-axis, wherein:
the x-axis sensor is an angular velocity sensor according to claim 9,
the driving arm, the first arm, and the second arm extend in the y-axis direction,
the driving circuit supplies voltages to the plurality of excitation electrodes so that the driving arms vibrate in the x-axis direction,
the y-axis sensor comprises
a piezoelectric body comprising a y-axis driving arm and a y-axis detecting arm which extend in the y-axis direction,
a y-axis driving circuit which supplies voltages to the y-axis driving arm so that the y-axis driving arm vibrates in the x-axis direction, and
a y-axis detecting circuit which detects signals generated by bending deformation of the y-axis detecting arm in the z-axis direction, and
the z-axis sensor comprises
a piezoelectric body comprising a z-axis driving arm and a z-axis detecting arm which extend in the y-axis direction,
a z-axis driving circuit which supplies voltages to the z-axis driving arm so that the z-axis driving arm vibrates in the x-axis direction, and
a z-axis detecting circuit which detects signals generated by bending deformations of the z-axis detecting arm in the x-axis direction.

11. The multi-axis angular velocity sensor according to claim 10, wherein the piezoelectric body in the x-axis sensor, the piezoelectric body in the y-axis sensor, and the piezoelectric body in the z-axis sensor are fixed to each other.

* * * * *